United States Patent
Ashibe et al.

(10) Patent No.: US 12,060,457 B2
(45) Date of Patent: Aug. 13, 2024

(54) RESIN COMPOSITION FOR DISPLAY SUBSTRATE, RESIN FILM FOR DISPLAY SUBSTRATE AND LAMINATE BODY CONTAINING THIS, IMAGE DISPLAY DEVICE, ORGANIC EL DISPLAY, AND MANUFACTURING METHOD OF THESE

(71) Applicant: Toray Industries, Inc., Tokyo (JP)

(72) Inventors: Tomoki Ashibe, Otsu (JP); Daichi Miyazaki, Otsu (JP)

(73) Assignee: Toray Industries, Inc., Tokyo (JP)

( * ) Notice: Subject to any disclaimer, the term of this patent is extended or adjusted under 35 U.S.C. 154(b) by 1059 days.

(21) Appl. No.: 16/961,504

(22) PCT Filed: Jan. 9, 2019

(86) PCT No.: PCT/JP2019/000303
§ 371 (c)(1),
(2) Date: Jul. 10, 2020

(87) PCT Pub. No.: WO2019/142703
PCT Pub. Date: Jul. 25, 2019

(65) Prior Publication Data
US 2020/0339754 A1    Oct. 29, 2020

(30) Foreign Application Priority Data
Jan. 18, 2018    (JP) ................... 2018-006115

(51) Int. Cl.
| | | |
|---|---|---|
| C08G 73/10 | (2006.01) | |
| C08J 5/18 | (2006.01) | |
| H10K 59/12 | (2023.01) | |
| H10K 71/00 | (2023.01) | |
| H10K 77/10 | (2023.01) | |

(52) U.S. Cl.
CPC ..... *C08G 73/1085* (2013.01); *C08G 73/1032* (2013.01); *C08G 73/1042* (2013.01); *C08G 73/1057* (2013.01); *C08G 73/1067* (2013.01); *C08G 73/1071* (2013.01); *C08G 73/1078* (2013.01); *C08G 73/1082* (2013.01); *C08J 5/18* (2013.01); *H10K 59/12* (2023.02); *H10K 71/00* (2023.02); *H10K 77/10* (2023.02); *C08J 2379/08* (2013.01)

(58) Field of Classification Search
CPC ............ C08G 73/1007; C08G 73/1078; C08G 73/1042; C08G 73/1057; C08G 73/1067; C08G 73/1071; C08G 73/1082; C08J 5/18; H10K 59/12; H10K 71/00; H10K 71/10; H05B 33/10
USPC ...................................................... 428/473.5
See application file for complete search history.

(56) References Cited

U.S. PATENT DOCUMENTS

| | | |
|---|---|---|
| 2010/0167022 A1 | 7/2010 | Adachi et al. |
| 2014/0327348 A1 | 11/2014 | Kim |
| 2014/0342137 A1 | 11/2014 | Kim et al. |
| 2016/0002407 A1 * | 1/2016 | Wakita ............... C08G 73/1039 528/188 |
| 2016/0251545 A1 | 9/2016 | Yun et al. |
| 2018/0362763 A1 | 12/2018 | Miyazaki et al. |

FOREIGN PATENT DOCUMENTS

| | | |
|---|---|---|
| EP | 3284771 A1 | 2/2018 |
| JP | 01299871 A | 12/1989 |
| JP | 2005246716 A | 9/2005 |
| JP | 2010155895 A | 7/2010 |
| JP | 2013079345 A | 5/2013 |
| JP | 2014187091 A | 10/2014 |
| JP | 2015507503 A | 3/2015 |
| JP | 2015507563 A | 3/2015 |

(Continued)

OTHER PUBLICATIONS

Japanese Notice of Reasons for Refusal for Japanese Application No. 2019-501734, dated Jan. 30, 2023 with translation, 6 pages.

(Continued)

*Primary Examiner* — Tri V Nguyen
(74) *Attorney, Agent, or Firm* — Buchanan Ingersoll & Rooney PC

(57) ABSTRACT

A resin composition for display substrates includes the following: the resin (a): a resin containing, as a main component, a repeating unit represented by the chemical formula (1), wherein the resin contains the total of 95 mass % or more of a tetracarboxylic acid residue A, having 2 or more carbon atoms and an SP value of 15 or more and 17 or less and a diamine residue having an SP value of 11 or more and 13 or less with respect to the total of 100 mass % of A and B contained in the resin; the solvent (b): a solvent having an SP value of 7.5 or more and less than 9.5; and the solvent (c): a solvent having an SP value of 9.5 or more and 14.0 or less;

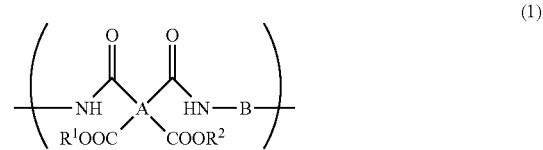

(1)

wherein $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion.

11 Claims, No Drawings

(56) References Cited

FOREIGN PATENT DOCUMENTS

| | | | |
|---|---|---|---|
| JP | 2016531997 A | 10/2016 | |
| WO | 2011122199 A1 | 10/2011 | |
| WO | 2013047451 A1 | 4/2013 | |
| WO | WO-2014168402 A1 * | 10/2014 | ........... B32B 17/064 |
| WO | 2016167038 A1 | 10/2016 | |
| WO | 2017038664 A1 | 3/2017 | |
| WO | 2017099183 A1 | 6/2017 | |

OTHER PUBLICATIONS

International Search Report and Written Opinion for International Application No. PCT/JP2019/000303, dated Apr. 16, 2019, 10 pages.
Chinese Office Action for Chinese Application No. 201980008615.X, dated Jul. 26, 2022 with translation, 10 pages.
Brandrup, J., et al., "Solubility Parameter Values," Polymer Handbook (4th ed.); 1999, 25 pages.

* cited by examiner

RESIN COMPOSITION FOR DISPLAY SUBSTRATE, RESIN FILM FOR DISPLAY SUBSTRATE AND LAMINATE BODY CONTAINING THIS, IMAGE DISPLAY DEVICE, ORGANIC EL DISPLAY, AND MANUFACTURING METHOD OF THESE

CROSS REFERENCE TO RELATED APPLICATIONS

This is the U.S. National Phase application of PCT/JP2019/000303, filed Jan. 9, 2019, which claims priority to Japanese Patent Application No. 2018-006115, filed Jan. 18, 2018, the disclosures of each of these applications being incorporated herein by reference in their entireties for all purposes.

FIELD OF THE INVENTION

The present invention relates to: resin compositions for display substrates; resin films for display substrates; those laminates, image display devices, and organic EL displays which contain the resin film; and methods of producing these.

BACKGROUND OF THE INVENTION

Polyimides are used as materials for various electronic devices such as semiconductors and displays because of their good electrical insulation properties, heat resistance, and mechanical characteristics. Recently, production of shock resistant, flexible image display devices has become possible by using heat resistant resin films of polyimide for the substrates of image display devices such as organic EL displays, electronic paper, and color filters. To use polyimides for electronic device materials, solutions containing polyamic acids, which are precursors of polyimides, are usually utilized. Typically, a support is coated with a solution containing a polyamic acid, and the resulting coating film is fired and thus imidized to yield a polyimide.

Similarly in using polyimide for a material for display substrates, a support is coated with a polyamic acid solution (hereinafter, suitably referred to as varnish), and the resulting coating film is fired to form a polyimide resin film. Polyimides for display substrates particularly need to have excellent mechanical characteristics and a small coefficient of thermal linear expansion (hereinafter, suitably referred to as CTE) to prevent the warpage of substrates during production. For example, Patent Literature 1 discloses an example in which a varnish containing a polyamic acid having a specific structure at an end thereof is used to produce a polyimide having excellent mechanical strength, and an example in which this polyimide is used to produce display substrates. In addition, the same Literature discloses an example in which a polar solvent such as N-methylpyrrolidone, for which a polyamic acid has excellent solubility, is used as a solvent for varnish.

In cases where a polyimide film is used for a display substrate, there will occur a problem associated with the poor barrier properties of the film, leading to easy infiltration of moisture and oxygen into the display internal. In organic EL displays, in particular, the light emitting elements can be deactivated easily due to infiltration of moisture, and thus, the display substrates require high barrier properties. Against this problem, for example, Patent Literature 2 discloses an example in which a film obtained by laminating a resin film and an inorganic film is used for display substrates.

Patent Literature

Patent Literature 1: WO2017/099183
Patent Literature 2: JP2005-246716A

SUMMARY OF THE INVENTION

The resin composition described in Patent Literature 1 enables a resin film having excellent mechanical strength to be obtained, but has a problem in that a display substrate for which the composition is used causes the display to exhibit insufficient reliability when bent. The display substrate described in Patent Literature 2 has a structure in which an organic film and an inorganic film are laminated, but has a problem in that the inorganic film is more likely to have cracks particularly in cases where the resin film used has a low CTE to prevent the warpage of the substrate. Hereinafter, a resin composition to be used for display substrates, that is, a resin composition for display substrates is suitably referred to as a "resin composition" for short. Similarly, a resin film to be used for display substrates, that is, a resin film for display substrates is suitably referred to as a "resin film" for short.

The present invention has been made in view of the above-mentioned problems, and a first object of the present invention is to provide: a resin film that has excellent flex resistance and reliability and can be used for display substrates, wherein the resin film has excellent mechanical strength and is a resin film for display substrates which is more unlikely to cause cracks to an inorganic film laminated on the resin film; and a resin composition for display substrates which enables the resin film to be produced and has excellent storage stability. In addition, a second object of the present invention is to provide a laminate, an image display device, and an organic EL display that each contain such a resin film for display substrates or a resin composition for display substrates and have excellent flex resistance and reliability.

To solve the above-mentioned problems and achieve the objects, a resin composition for display substrates according to embodiments of the present invention is characterized by including the following resin (a), solvent (b), and solvent (c).

Resin (a): a resin containing, as a main component, a repeating unit represented by the chemical formula (1), wherein the resin contains the total of 95 mass % or more of a tetracarboxylic acid residue having an SP value of 15 or more and 17 or less and a diamine residue having an SP value of 11 or more and 13 or less with respect to the total of 100 mass % of A and B contained in the resin Solvent (b): a solvent having an SP value of 7.5 or more and less than 9.5

Solvent (c): a solvent having an SP value of 9.5 or more and 14.0 or less

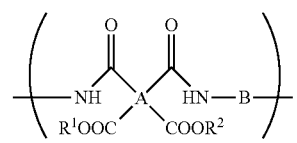

(1)

wherein, in the chemical formula (1), A represents a tetravalent tetracarboxylic acid residue having 2 or more carbon atoms; B represents a divalent diamine residue having 2 or more carbon atoms; and $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion.

In addition, a resin composition for display substrates according to an embodiment of the present invention is characterized in that, in the above-mentioned invention, the boiling point of the solvent of the solvents (c) which has the lowest boiling point is 10° C. or more higher than the boiling point of the solvent of the solvents (b) which has the highest boiling point.

In addition, a resin composition for display substrates according to an embodiment of the present invention is characterized in that, in the above-mentioned invention, the solvent (b) is a solvent having a structure represented by the chemical formula (2).

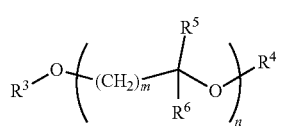

(2)

wherein, in the chemical formula (2), m and n independently represent a positive integer of 1 to 5; and $R^3$ to $R^6$ independently represent a hydrogen atom, hydrocarbon group having 1 to 10 carbon atoms, or acyl group having 1 to 10 carbon atoms.

In addition, a resin composition for display substrates according to an embodiment of the present invention is characterized in that, in the above-mentioned invention, the resin composition contains 5 to 60 mass % of the solvent(s) (b) and 40 to 95 mass % of the solvent(s) (c) with respect to 100 mass % of all the solvents including the solvent(s) (b) and the solvent(s) (c).

In addition, a resin composition for display substrates according to an embodiment of the present invention is characterized in that, in the above-mentioned invention, the resin (a) further contains at least one of a repeating unit represented by the chemical formula (3) and a repeating unit represented by the chemical formula (4), and satisfies $0.05 \leq (2r+q)/(2p+2q+2r) \leq 0.3$, wherein p, q, and r are the molar ratio of the repeating unit represented by the chemical formula (1), the molar ratio of the repeating unit represented by the chemical formula (3), and the molar ratio of the repeating unit represented by the chemical formula (4) respectively.

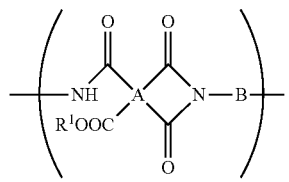

(3)

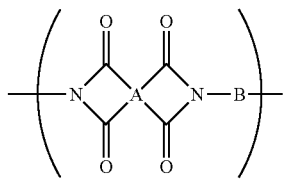

(4)

wherein, in the chemical formula (3) and chemical formula (4), A represents a tetravalent tetracarboxylic acid residue having 2 or more carbon atoms; B represents a divalent diamine residue having 2 or more carbon atoms; and $R^1$ represents a hydrogen atom, hydrocarbon group having 1 to 10 carbon atoms, alkylsilyl group having 1 to 10 carbon atoms, alkali metal ion, ammonium ion, imidazolium ion, or pyridinium ion.

In addition, a resin composition for display substrates according to an embodiment of the present invention is characterized in that, in the above-mentioned invention and in the chemical formula (1), the chemical formula (3), and the chemical formula (4), A has a structure represented by the chemical formula (5) or a structure represented by the chemical formula (6), and B has a structure represented by the chemical formula (7).

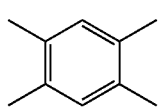

(5)

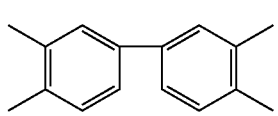

(6)

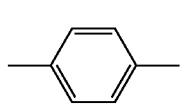

(7)

In addition, a resin composition for display substrates according to an embodiment of the present invention is characterized in that, in the above-mentioned invention, the resin (a) is a resin having an imide group concentration of 35 to 45 mass % when imidized.

In addition, a resin composition for display substrates according to an embodiment of the present invention is characterized in that, in the above-mentioned invention, the resin (a) has a structure represented by the chemical formula (8).

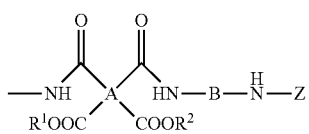

(8)

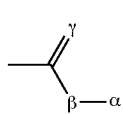

(9)

wherein, in the chemical formula (8), A represents a tetravalent tetracarboxylic acid residue having 2 or more carbon atoms; B represents a divalent diamine residue having 2 or more carbon atoms; Z is a structure represented by the chemical formula (9); $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion, and wherein, in the chemical formula (9), a represents a monovalent hydrocarbon group having 2 or more carbon atoms; and β and γ independently represent an oxygen atom or sulfur atom.

In addition, a method of producing a resin film for display substrates according to embodiments of the present invention is characterized by including: a film-forming step of forming, on a support, a coating film of the resin composition for display substrates according to any one embodiment of the above-mentioned inventions; and a heating step of heating the coating film at a temperature of 220° C. or more to produce the resin film for display substrates.

In addition, a method of producing an image display device according to an embodiment of the present invention is characterized by including: a film-forming step of forming, on a support, a coating film of the resin composition for display substrates according to any one embodiment of the above-mentioned inventions; a heating step of heating the coating film at a temperature of 220° C. or more to produce the resin film for display substrates; and an element-forming step of forming an image displaying element on the resin film for display substrates.

In addition, a method of producing an organic EL display according to an embodiment of the present invention is characterized by including: a film-forming step of forming, on a support, a coating film of the resin composition for display substrates according to any one embodiment of the above-mentioned inventions; a heating step of heating the coating film at a temperature of 220° C. or more to produce the resin film for display substrates; and an element-forming step of forming an organic EL element on the resin film for display substrates.

In addition, a resin film for display substrates according to an embodiment of the present invention is a resin film for display substrates which contains, as a main component, a repeating unit represented by the chemical formula (4) and is characterized in that the ratio of the coefficient of thermal linear expansion (A) of a first resin film to the coefficient of thermal linear expansion (B) of a second resin film is (A):(B)=1.0:1.3 to 1.0:2.0, wherein the first resin film is obtained by etching one face of the resin film for display substrates in the film thickness direction to reduce the film thickness to half, and wherein the second resin film is obtained by etching the other face of the resin film for display substrates to reduce the film thickness to half;

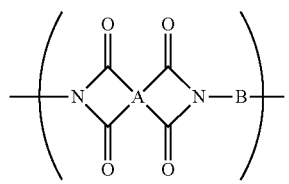

(4)

wherein, in the chemical formula (4), A represents a tetravalent tetracarboxylic acid residue having 2 or more carbon atoms; and B represents a divalent diamine residue having 2 or more carbon atoms.

In addition, a resin film for display substrates according to an embodiment of the present invention is a resin film for display substrates which is obtained from the resin composition for display substrates according to any one embodiment of the above-mentioned inventions and is characterized in that the ratio of the coefficient of thermal linear expansion (A) of a first resin film to the coefficient of thermal linear expansion (B) of a second resin film is (A):(B)=1.0:1.3 to 1.0:2.0, wherein the first resin film is obtained by etching one face of the resin film for display substrates in the film thickness direction to reduce the film thickness to half, and wherein the second resin film is obtained by etching the other face of the resin film for display substrates to reduce the film thickness to half.

In addition, a laminate according to embodiments of the present invention is a laminate that is composed of the resin film for display substrates according to any one embodiment of the above-mentioned inventions and an inorganic film and is characterized in that the face of the resin film for display substrates to be in contact with the inorganic film is selected by the method including etching a resin film for display substrates from one face in the film thickness direction to a thickness of the half of the original thickness to obtain a first resin film; etching another resin film for display substrates from the other face in the film thickness to a thickness of half of the original thickness to obtain a second resin film; comparing coefficients of the thermal linear expansion of the first and second resin films; and selecting the face of the first or second resin film having a smaller coefficient of the thermal linear expansion as the face to be in contact with the inorganic film.

In addition, an image display device according to embodiments of the present invention is characterized by including the resin film for display substrates according to any one embodiment of the above-mentioned inventions.

In addition, an image display device according to embodiments of the present invention is characterized by including the laminate according to the above-mentioned inventions.

In addition, an organic EL display according to embodiments of the present invention is characterized by including the resin film for display substrates according to any one embodiment of the above-mentioned inventions.

In addition, an organic EL display according to embodiments of the present invention is characterized by including the laminate according to the above-mentioned inventions.

The present invention can provide: a resin film that has excellent flex resistance and reliability and can be used for display substrates, wherein the resin film has excellent mechanical strength and is a resin film for display substrates which is more unlikely to cause cracks to an inorganic film laminated on the resin film; and a resin composition for display substrates which enables the resin film to be produced and has excellent storage stability. In addition, the present invention can provide a laminate, an image display device, and an organic EL display that are obtained by using such a resin film for display substrates or a resin composition for display substrates and have excellent flex resistance and reliability.

DETAILED DESCRIPTION OF EMBODIMENTS OF THE INVENTION

Below, embodiments of the present invention will be described in detail. However, the present invention is not limited to the following embodiments, but can be embodied with various changes in accordance with the purposes and applications.

<Resin Composition for Display Substrates>

One of the embodiments according to the present invention is a resin composition for display substrates which includes the following resin (a), solvent (b), and solvent (c).

Resin (a): a resin containing, as a main component, a repeating unit represented by the chemical formula (1), wherein the resin contains the total of 95 mass % or more of a tetracarboxylic acid residue having an SP value of 15 or more and 17 or less and a diamine residue having an SP value of 11 or more and 13 or less with respect to the total of 100 mass % of A and B contained in the resin Solvent (b): a solvent having an SP value of 7.5 or more and less than 9.5

Solvent (c): a solvent having an SP value of 9.5 or more and 14.0 or less

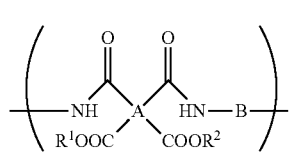

(1)

wherein, in the chemical formula (1), A represents a tetravalent tetracarboxylic acid residue having 2 or more carbon atoms; B represents a divalent diamine residue having 2 or more carbon atoms; $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion.

Use of a resin composition according to an embodiment of the present invention makes it possible to produce a resin film having excellent mechanical strength. Furthermore, it is possible to produce a display substrate that is more unlikely to cause cracks to an inorganic film and has excellent flex resistance and reliability.

The reason why a resin composition according to an embodiment of the present invention expresses the above-mentioned effects is inferred as below-mentioned. In a resin composition according to an embodiment of the present invention, 95 mass % or more of the tetracarboxylic acid residue and the diamine residue, which are constituents of the resin, contain a structure having an SP value within a specific range. On the other hand, the solvent partially contains a structure having an SP value within a range lower than the specific range. An SP value is also called a solubility parameter and is a parameter that serves as an index of solubility or compatibility. A resin composition according to an embodiment of the present invention has a large difference in the SP value between the resin and some of the solvents, and thus, the resin composition results in containing a solvent for which the resin has low solubility.

In general, polyimide is formed into a film by coating a support with a polyamic acid solution, which is a solution of a polyimide precursor, and firing the resulting coating film. It is known that, in this firing process, the polyamic acid allows the resin ends to be bound at the same time as the occurrence of the imidization reaction, and results in having an increased molecular weight. It is considered that, when this takes place, the larger the mobility of the resin during firing is, the higher the bonding probability between the resin ends is, and accordingly the larger the molecular weight of the obtained polyimide film is. A resin composition according to an embodiment of the present invention contains a solvent for which the resin has low solubility, and thus, a coating is formed on the surface of a film when the solvent is dried, with the result that the solvent tends to remain in the inside of the film during firing. Thus, the resin during firing has larger fluidity, and the bonding probability between the resin ends is increased, enabling a resin having a larger molecular weight to be obtained. This allows the obtained polyimide film (resin film) to have excellent mechanical characteristics.

In addition, a polyimide film for display substrates (which is an example of a resin film for display substrates) is generally used with an inorganic film having gas barrier properties laminated thereon to prevent permeation of moisture and the like. Furthermore, a resin film for display substrates needs to have a low CTE to prevent the warpage of a substrate. However, studies made by the present inventors have revealed that an inorganic film formed on a polyimide film having a small CTE is subjected to tensile stress, and thus, is more likely to generate cracks. With a resin composition according to an embodiment of the present invention, a coating is formed on the surface of the film when the solvent is dried, as above-mentioned. When this takes place, the resin on the surface of the film cannot be oriented sufficiently, and thus, the surface of the film results in having a large CTE. This makes it possible to infer that the surface of the film has a large CTE even though the whole film has a low CTE, and that a tensile stress applied to the inorganic film laminated on the surface of the film is small, enabling cracks to be prevented from being generated in the inorganic film.

In addition, one of the embodiments according to the present invention is a resin film for display substrates which contains, as a main component, a repeating unit represented by the chemical formula (4), wherein the ratio of the CTE (A) of a first resin film to the CTE (B) of a second resin film is (A):(B)=1.0:1.3 to 1.0:2.0, wherein the first resin film is obtained by etching one face of the resin film in the film thickness direction to reduce the film thickness to half, and wherein the second resin film is obtained by etching the other face of the resin film to reduce the film thickness to half.

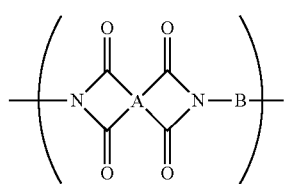

(4)

wherein, in the chemical formula (4), A represents a tetravalent tetracarboxylic acid residue having 2 or more carbon atoms; and B represents a divalent diamine residue having 2 or more carbon atoms.

In a resin film according to an embodiment of the present invention, the surface of the film has a large CTE even if the whole film has a small CTE, and thus, an inorganic film on the surface of the film is susceptible to a compressive stress. This makes it possible to prevent the inorganic film from generating cracks. Using such a resin film as a material makes it possible to produce display substrates having excellent flex resistance and reliability. In addition, a resin film according to an embodiment of the present invention is not limited to a resin film containing, as a main component, a repeating unit represented by the above-mentioned chemical formula (4), but may be any resin film obtained from a resin composition in the present invention as long as the resin film satisfies the condition of the above-mentioned ratio of CTE (A) to CTE (B).

(Resin)

The resin (a) contained in a resin composition for display substrates according to an embodiment of the present invention is a resin containing, as a main component, a repeating unit represented by the chemical formula (1) and contains, in the below-mentioned amounts, a tetracarboxylic acid residue and a diamine residue that have the below-mentioned characteristics. Specifically, the resin (a) contains A and B (A and B in the chemical formula (1)), and the resin (a) contains the total of 95 mass % or more of a tetracarboxylic acid residue having an SP value of 15 or more and 17 or less and a diamine residue having an SP value of 11 or more and 13 or less with respect to the total of 100 mass % of A and B. As used herein, a "main component" refers to a component that accounts for 50 mol % or more of all repeating units contained in the resin.

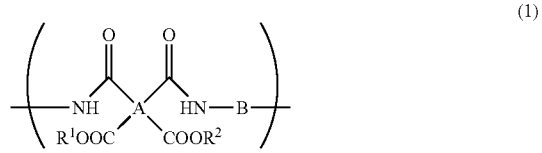

(1)

wherein, in the chemical formula (1), A represents a tetravalent tetracarboxylic acid residue having 2 or more carbon atoms; B represents a divalent diamine residue having 2 or more carbon atoms; $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion.

As below-mentioned, the resin (a) can be converted to polyimide by heating treatment, chemical treatment, and the like. That is, the resin (a) can be regarded as a polyimide precursor.

The total amount of a tetracarboxylic acid residue having an SP value of 15 or more and 17 or less and a diamine residue having an SP value of 11 or more and 13 or less is 95 mass % or more with respect to the total of 100 mass % of A and B. The amount of these tetracarboxylic acid residue and diamine residue is preferably 96 mass % or more, more preferably 97 mass % or more, still more preferably 98 mass % or more. Alternatively, the amount of these tetracarboxylic acid residue and diamine residue may be 100 mass %.

In general, a method of calculating an SP value is a method in which a value of solubility parameter is calculated from properties such as heat of vaporization, or a method in which a value of solubility parameter is estimated from a molecular structure. Values used herein are calculated from molecular structures on the basis of the method of Fedors described in p. VII/675, Solubility Parameter Values in "Polymer Handbook (4th ed.); edited by J. Brandrup, E. H. Immergut, E. A. Grulke". The unit used for SP values is $(cal/cm^3)^{1/2}$.

In the present invention, the mass of A refers to the mass of the remaining portion obtained by removing four carboxylic groups from a tetracarboxylic acid containing A. The mass of B refers to the mass of the remaining portion obtained by removing two amino groups from a diamine containing B. For example, in a case where A is a pyromellitic acid residue, the mass of A is the mass of $C_6H_2$ obtained by removing four carboxylic groups from the pyromellitic acid. In a case where B is a paraphenylenediamine residue, the mass of B is the mass of $C_6H_4$ obtained by removing two amino groups from the paraphenylenediamine.

In the chemical formula (1), A is preferably a tetravalent hydrocarbon group having 2 to 80 carbon atoms. In addition, A may be a tetravalent organic group having 2 to 80 carbon atoms and including hydrogen and carbon as essential elements and one or more atoms selected from boron, oxygen, sulfur, nitrogen, phosphorus, silicon, and halogens. For each of boron, oxygen, sulfur, nitrogen, phosphorus, silicon, and halogens contained in A, the number of atoms included is preferably in the range of 20 or less, more preferably in the range of 10 or less.

Examples of tetracarboxylic acids that give A are listed below. Examples of aromatic tetracarboxylic acids include monocyclic aromatic tetracarboxylic acid compounds, various isomers of biphenyltetracarboxylic acids, bis(dicarboxyphenyl) compounds, bis(dicarboxyphenoxyphenyl) compounds, various isomers of naphthalene or condensed polycyclic aromatic tetracarboxylic acids, bis(trimellitic monoester) compounds, and the like. In addition, examples of aliphatic tetracarboxylic acids include linear aliphatic tetracarboxylic acid compounds, alicyclic tetracarboxylic acid compounds, and the like.

Among the tetracarboxylic acids that give A, specific examples of tetracarboxylic acids having an SP value of 15 or more and 17 or less will be listed below. Examples thereof include a pyromellitic acid (having an SP value of 16.3), 3,3',4,4'-biphenyltetracarboxylic acid (having an SP value of 15.2), 2,3,3',4'-biphenyltetracarboxylic acid (having an SP value of 15.2), 2,2',3,3'-biphenyltetracarboxylic acid (having an SP value of 15.2), 3,3',4,4'-benzophenonetetracarboxylic acid (having an SP value of 15.5), 2,2',3,3'-benzophenonetetracarboxylic acid (having an SP value of 15.5), bis(3,4-dicarboxyphenyl) ether (having an SP value of 15.2), 1,2,5,6-naphthalenetetracarboxylic acid (having an SP value of 15.9), 1,4,5,8-naphthalenetetracarboxylic acid (having an SP value of 15.9), 2,3,6,7-naphthalenetetracarboxylic acid (having an SP value of 15.9), 3,4,9,10-perylenetetracarboxylic acid (having an SP value of 15.5), and the like.

Among the tetracarboxylic acids that give A, specific examples of tetracarboxylic acids having an SP value of less than 15 or more than 17 will be listed below. Examples thereof include, 2,3,5,6-pyridinetetracarboxylic acid (having an SP value of 17.3), 2,2-bis(3,4-dicarboxyphenyl)hexafluoropropane (having an SP value of 13.4), 2,2-bis(2,3-dicarboxyphenyl)hexafluoropropane (having an SP value of 13.4), 2,2-bis(3,4-dicarboxyphenyl)propane (having an SP value of 13.9), 2,2-bis(2,3-dicarboxyphenyl)propane (having an SP value of 13.9), 1,1-bis(3,4-dicarboxyphenyl)ethane (having an SP value of 14.3), 1,1-bis(2,3-dicarboxyphenyl)ethane (having an SP value of 14.3), bis(3,4-dicarboxyphenyl)methane (having an SP value of 14.8), bis(2,3-dicarboxyphenyl)methane (having an SP value of 14.8), 2,2-bis[4-(3,4-dicarboxyphenoxy)phenyl]hexafluoropropane (having an SP value of 13.1), 2,2-bis[4-(2,3-dicarboxyphenoxy)phenyl]hexafluoropropane (having an SP value of 13.1), 2,2-bis[4-(3,4-dicarboxyphenoxy)phenyl]propane (having an SP value of 13.4), 2,2-bis[4-(2,3-dicarboxyphenoxy)phenyl]propane (having an SP value of 13.4), 2,2-bis[4-(3,4-dicarboxyphenoxy)phenyl]ether (having an SP value of 14.1), p-phenylenebis(trimellitic monoester) (having an SP value of 14.7), p-biphenylenebis(trimellitic monoester) (having an SP value of 14.3), ethylenebis(trimellitic monoester) (having an SP value of 14.5), bisphenol A bis(trimellitic monoester) (having an SP value of 13.6), and the like.

A resin (a) having a larger amount of tetracarboxylic acid residue having an SP value of less than 15 causes the resulting resin film to have insufficient mechanical characteristics. In addition, a resin (a) having a larger amount of tetracarboxylic acid residue having an SP value of more than 17 causes the resulting resin composition to have lower storage stability.

From the viewpoint of preventing the warpage of a substrate, it is preferable to use, as a tetracarboxylic acid that gives A, 50 mol % or more of aromatic tetracarboxylic acid with respect to the total amount of tetracarboxylic acids. A preferably contains, as a main component, a tetravalent tetracarboxylic acid residue represented by the chemical formula (5) or chemical formula (6) among others.

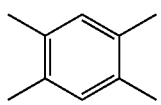

(5)

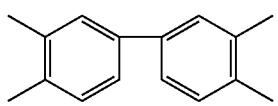

(6)

That is, it is preferable to use a pyromellitic acid or 3,3',4,4'-biphenyltetracarboxylic acid as a main component of A. As used herein, a "main component" refers to a component that accounts for 50 mol % or more of the total amount of tetracarboxylic acids. More preferably, a main component of A is a component that accounts for 80 mol % or more of the total amount of tetracarboxylic acids. A polyimide obtained from such a tetracarboxylic acid allows the resulting resin film to have a small CTE, and thus, the warpage of a substrate is small when the film is formed on the substrate, with the result that generation of an adsorption error can be prevented during transportation of the substrate.

As a tetracarboxylic acid that gives A, a silicon-containing tetracarboxylic acid such as dimethylsilane diphthalic acid or 1,3-bis(phthalic acid)tetramethyl disiloxane may be used with a view to increasing the coatability on a support and the resistance to oxygen plasma used for cleaning and the like and to UV ozone processing. It is preferable that such a silicon-containing tetracarboxylic acid accounts for 1 to 30 mol % of the total amount of tetracarboxylic acids.

For the tetracarboxylic acids given above as examples, one or more of the hydrogen atoms contained in a tetracarboxylic acid residue may be each substituted with a hydrocarbon group having 1 to 10 carbon atoms such as a methyl group or ethyl group; a fluoroalkyl group having 1 to 10 carbon atoms such as a trifluoromethyl group; or another group such as F, Cl, Br, or I. In addition, the residue in which one or more of the hydrogen atoms is/are each substituted with an acidic group such as OH, COOH, $SO_3H$, $CONH_2$, or $SO_2NH_2$ enhances the solubility of the resin or precursor thereof in an aqueous alkali solution, and thus, is preferably used for the below-mentioned photosensitive resin composition.

In the chemical formula (1), B is preferably a tetravalent hydrocarbon group having 2 to 80 carbon atoms. In addition, B may be a tetravalent organic group having 2 to 80 carbon atoms and including hydrogen and carbon as essential elements and one or more atoms selected from boron, oxygen, sulfur, nitrogen, phosphorus, silicon, and halogens. For each of boron, oxygen, sulfur, nitrogen, phosphorus, silicon, and halogens contained in B, the number of atoms included is preferably in the range of 20 or less, more preferably in the range of 10 or less.

Examples of diamines that give B are listed below. Examples of diamine compounds containing an aromatic ring include; monocyclic aromatic diamine compounds, naphthalene- or condensed polycyclic aromatic diamine compounds, bis(diaminophenyl) compounds or various derivatives thereof, 4,4'-diaminobiphenyl or various derivatives thereof, bis(aminophenoxy) compounds, bis(3-amino-4-hydroxyphenyl) compounds, bis(aminobenzoyl) compounds, heterocyclic-ring-containing diamine compounds; the same diamine compounds as these except that one or more of the hydrogen atoms bound to the aromatic ring contained in the diamine compound is/are each substituted with a hydrocarbon or halogen; and the like. In addition, examples of aliphatic diamine compounds include linear diamine compounds, alicyclic diamine compounds, and the like.

Among the diamines that give B, specific examples of diamines having an SP value of 11 or more and 13 or less will be listed below. Examples thereof include m-phenylenediamine (having an SP value of 12.3), p-phenylenediamine (having an SP value of 12.3), 1,5-naphthalenediamine (having an SP value of 12.6), 2,6-naphthalenediamine (having an SP value of 12.6), 9,10-anthracenediamine (having an SP value of 12.8), 2,7-diaminofluorene (having an SP value of 12.9), 3,4'-diaminodiphenyl ether (having an SP value of 12.3), 4,4'-diaminodiphenyl ether (having an SP value of 12.3), 3,4'-diaminodiphenylmethane (having an SP value of 11.9), 4,4'-diaminodiphenylmethane (having an SP value of 11.9), 3,4'-diaminodiphenyl sulfide (having an SP value of 12.6), 4,4'-diaminodiphenyl sulfide (having an SP value of 12.6), 4-aminophenyl 4-aminobenzoate (having an SP value of 12.6), 9,9-bis(4-aminophenyl)fluorene (having an SP value of 12.3), 4,4'-diaminobiphenyl (having an SP value of 12.2), 2,2'-dimethyl-4,4'-diaminobiphenyl (having an SP value of 11.7), 2,2'-diethyl-4,4'-diaminobiphenyl (having an SP value of 11.3), 3,3'-dimethyl-4,4'-diaminobiphenyl (having an SP value of 11.7), 3,3'-diethyl-4,4'-diaminobiphenyl (having an SP value of 11.3), 2,2',3,3'-tetramethyl-4,4'-diaminobiphenyl (having an SP value of 11.3), 3,3',4,4'-tetramethyl-4,4'-diaminobiphenyl (having an SP value of 11.3), 2,2'-di(trifluoromethyl)-4,4'-diaminobiphenyl (having an SP value of 11.3), bis(4-aminophenoxy)biphenyl (having an SP value of 12.2), bis[4-(4-aminophenoxy)phenyl] ether (having an SP value of 12.2), 2,2-bis[4-(4-aminophenoxy)phenyl]propane (having an SP value of 11.6), 2,2-bis[4-(4-aminophenoxy)phenyl]hexafluoropropane (having an SP value of 11.3), 1,4-bis(4-aminophenoxy)benzene (having an SP value of 12.2), 1,3-bis(3-aminophenoxy)benzene (having an SP value of 12.2), 1,3-bis(4-aminophenoxy)benzene (having an SP value of 12.2), 2-(4-aminophenyl)-5-aminobenzoxazole (having an SP value of 12.9), 2-(3-aminophenyl)-5-aminobenzoxazole (having an SP value of 12.9), 2-(4-aminophenyl)-6-aminobenzoxazole (having an SP value of 12.9), 2-(3-aminophenyl)-6-aminobenzoxazole (having an SP value of 12.9), 2,2'-bis[(3-aminophenyl)-5-benzoxazolyl]hexafluoropropane (having an SP value of 12.0), 2,2'-bis[(4-aminophenyl)-5-benzoxazolyl]hexafluoropropane (having an SP value of 12.0), bis[(3-aminophenyl)-5-benzoxazolyl] (having an SP value of 12.9), bis[(4-aminophenyl)-5-benzoxazolyl] (having an SP value of 12.9), bis[(3-aminophenyl)-6-benzoxazolyl] (having an SP value of 12.9), bis[(4-aminophenyl)-6-benzoxazolyl] (having an SP value of 12.9), and the like.

Among the diamines that give B, specific examples of diamines having an SP value of less than 11 or more than 13 will be listed below. Examples thereof include, 3,5-diaminobenzoate (having an SP value of 14.2), 4,4'-diaminobenzanilide (having an SP value of 13.8), 3-carboxy-4,4'-diaminodiphenyl ether (having an SP value of 13.5), 1,3-bis(4-anilino)tetramethyl disiloxane (having an SP value of 10.0), bis(3-amino-4-hydroxyphenyl)hexafluoropropane (having an SP value of 13.2), bis(3-amino-4-hydroxyphenyl)propane (having an SP value of 13.8), bis(3-amino-4-hydroxyphenyl) methylene (having an SP value of 14.9), bis(3-amino-4-hydroxy phenyl) ether (having an SP value of 15.5), bis(3-amino-4-hydroxy)biphenyl (having an SP value of 15.5), 9,9-bis(3-amino-4-hydroxy phenyl)fluorene (having an SP value of 14.3), 2,2'-bis[N-(3-amino benzoyl)-3-amino-4-hydroxy phenyl]hexafluoropropane (having an SP value of 14.3), 2,2'-bis[N-(4-amino benzoyl)-3-amino-4-hydroxy phenyl]hexafluoropropane (having an SP value of 14.3), 2,2'-bis[N-(3-aminobenzoyl)-3-amino-4-hydroxyphenyl] propane (having an SP value of 14.7), 2,2'-bis[N-(4-aminobenzoyl)-3-amino-4-hydroxy phenyl]propane (having an SP value of 14.7), 9,9-bis[N-(3-aminobenzoyl)-3-amino-4-hydroxy phenyl]fluorene (having an SP value of 14.9), 9,9-bis [N-(4-aminobenzoyl)-3-amino-4-hydroxyphenyl]fluorene (having an SP value of 14.9), N,N'-bis(3-aminobenzoyl)-2,5-diamino-1,4-dihydroxybenzene (having an SP value of 16.5), N,N'-bis(4-aminobenzoyl)-2,5-diamino-1,4-dihydroxybenzene (having an SP value of 16.5), N,N'-bis(3-aminobenzoyl)-4,4'-diamino-3,3-dihydroxybiphenyl (having an SP value of 15.7), N,N'-bis(4-aminobenzoyl)-4,4'-diamino-3,3-dihydroxybiphenyl (having an SP value of 15.7), N,N'-bis(3-aminobenzoyl)-3,3'-diamino-4,4-dihydroxybiphenyl (having an SP value of 15.7), N,N'-bis(4-aminobenzoyl)-3,3'-diamino-4,4-dihydroxybiphenyl (having an SP value of 15.7), 1,4-bis(5-amino-2-benzoxazolyl) benzene (having an SP value of 13.2), 1,4-bis(6-amino-2-benzoxazolyl)benzene (having an SP value of 13.2), 1,3-bis (5-amino-2-benzoxazolyl)benzene (having an SP value of 13.2), 1,3-bis(6-amino-2-benzoxazolyl)benzene (having an SP value of 13.2), 2,6-bis(4-amino phenyl)benzobisoxazole (having an SP value of 13.6), 2,6-bis(3-aminophenyl)benzobisoxazole (having an SP value of 13.6), ethylenediamine (having an SP value of 10.9), propylenediamine (having an SP value of 10.5), butanediamine (having an SP value of 10.2), pentanediamine (having an SP value of 10.0), hexanediamine (having an SP value of 9.8), octanediamine (having an SP value of 9.6), nonanediamine (having an SP value of 9.5), decanediamine (having an SP value of 9.4), undecanediamine (having an SP value of 9.4), dodecanediamine (having an SP value of 9.3), 1,12-(4,9-dioxa)dodecanediamine (having an SP value of 9.7), 1,8-(3,6-dioxa)octanediamine (having an SP value of 10.1), 1,3-bis(3-aminopropyl)tetramethyl disiloxane (having an SP value of 8.6), cyclohexanediamine (having an SP value of 10.4), 4,4'-methylenebis(cyclohexylamine) (having an SP value of 9.8), isophoronediamine (having an SP value of 9.4), and the like.

As diamines that give B, these diamines may be used in their original form or in the form of the corresponding trimethylsilylated diamines. Two or more thereof may be used in combination.

A resin (a) having a larger amount of diamine residue having an SP value of less than 11 causes the resulting resin film to have insufficient mechanical characteristics. In addition, a resin (a) having a larger amount of diamine residue having an SP value of more than 13 causes the resulting resin composition to have lower storage stability.

From the viewpoint of preventing the warpage of a substrate, it is preferable to use, as a diamine that gives B, 50 mol % or more of aromatic diamine compound with respect to the total amount of diamine compounds. B preferably contains, as a main component, a divalent diamine residue represented by the chemical formula (7) among others.

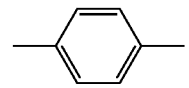

(7)

That is, it is preferable to use p-phenylene diamine as a main component of B. As used herein, a "main component" refers to a component that accounts for 50 mol % or more of the total amount of diamine compounds. More preferably, a main component of B is a component that accounts for 80 mol % or more of the total amount of diamine compounds. A polyimide obtained using p-phenylene diamine allows the resulting resin film to have a small CTE, and thus, the warpage of a substrate is small when the film is formed on the substrate, with the result that generation of an adsorption error can be prevented during transportation of the substrate.

It is particularly preferable that A in the chemical formula (1) contains, as a main component, a tetravalent tetracarboxylic acid residue represented by the chemical formula (5) or the chemical formula (6), and that B contains, as a main component, a divalent diamine residue represented by the chemical formula (7). A polyimide having such a structure allows the resulting resin film to have a smaller CTE, and thus, the warpage of a substrate is smaller when the film is formed on the substrate, with the result that generation of an adsorption error can more stably be prevented during transportation of the substrate.

As a diamine that gives B, a silicon-containing diamine such as 1,3-bis(3-aminopropyl)tetramethyl disiloxane or 1,3-bis(4-anilino)tetramethyl disiloxane may be used with a view to increasing the coatability on a support and the resistance to oxygen plasma used for cleaning and the like and to UV ozone processing. It is preferable that such a silicon-containing diamine compound accounts for 1 to 30 mol % of the total amount of diamine compounds.

For the diamine compounds given above as examples, one or more of the hydrogen atoms contained in a diamine compound may be substituted with a hydrocarbon group having 1 to 10 carbon atoms such as a methyl group or ethyl group; a fluoroalkyl group having 1 to 10 carbon atoms such as a trifluoromethyl group; or another group such as F, Cl, Br, or I. In addition, the diamine compound in which one or more of the hydrogen atoms is/are each substituted with an acidic group such as OH, COOH, $SO_3H$, $CONH_2$, or $SO_2NH_2$ enhances the solubility of the resin or precursor thereof in an aqueous alkali solution, and thus, is preferably used for the below-mentioned photosensitive resin composition.

In an embodiment of the present invention, a resin (a) may further contain at least one of a repeating unit represented by the chemical formula (3) and a repeating unit represented by the chemical formula (4) in addition to the above-mentioned repeating unit represented by the chemical formula (1).

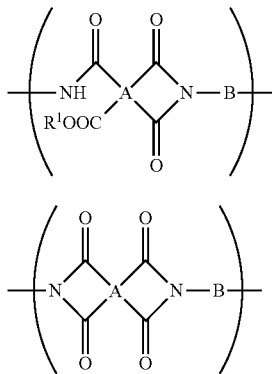

wherein, in the chemical formula (3) and chemical formula (4), A represents a tetravalent tetracarboxylic acid residue having 2 or more carbon atoms; B represents a divalent diamine residue having 2 or more carbon atoms; and $R^1$ represents a hydrogen atom, hydrocarbon group having 1 to 10 carbon atoms, alkylsilyl group having 1 to 10 carbon atoms, alkali metal ion, ammonium ion, imidazolium ion, or pyridinium ion. In particular, A in the above-mentioned chemical formula (1), chemical formula (3), and chemical formula (4) preferably has a structure represented by the chemical formula (5) or a structure represented by the chemical formula (6). B preferably has a structure represented by the chemical formula (7).

A repeating unit represented by the chemical formula (3) and a repeating unit represented by the chemical formula (4) can each be regarded as a structure obtained by imide ring closure of a repeating unit represented by the chemical formula (1) by heat treatment, chemical treatment, or the like. That is, a resin that contains a repeating unit represented by the chemical formula (1) and that contains at least one of a repeating unit represented by the chemical formula (3) and a repeating unit represented by the chemical formula (4) can also be regarded as a polyimide precursor that is a resin a part of which is imidized.

Herein, p, q, and r are assumed to be a molar ratio of a repeating unit represented by the chemical formula (1), a molar ratio of a repeating unit represented by the chemical formula (3), and a molar ratio of a repeating unit represented by the chemical formula (4) respectively to such a resin containing the repeating units as above-mentioned. p represents an integer of 1 or greater, and q and r independently represent an integer of 0 or 1 or greater. In this case, the resin (a) preferably satisfies the relationship $0.05 \leq (2r+q)/(2p+2q+2r) \leq 0.3$. The resin (a) more preferably satisfies the relationship $0.10 \leq (2r+q)/(2p+2q+2r)$, still more preferably satisfies the relationship $0.13 \leq (2r+q)/(2p+2q+2r)$, from the viewpoint of the mechanical characteristics of the resin film. In addition, the resin (a) more preferably satisfies the relationship $(2r+q)/(2p+2q+2r) \leq 0.27$, still more preferably satisfies the relationship $(2r+q)/(2p+2q+2r) \leq 0.25$, from the viewpoint of the storage stability of the resin composition. Other preferable ranges may be found by arbitrarily combining the upper and lower limit values given above. Thus, the resin (a) also preferably satisfies the relationship $0.10 \leq (2r+q)/(2p+2q+2r) \leq 0.27$.

Here, "$(2r+q)/(2p+2q+2r)$" indicates a ratio of the number of bonds $(2r+q)$ in imide ring closure to the number of all bonds $(2p+2q+2r)$ in the bonds of a polyimide precursor (the reaction portions between a tetracarboxylic dianhydride and a diamine compound). That is, "$(2r+q)/(2p+2q+2r) \times 100$" indicates the imidization rate of a polyimide precursor. Accordingly, the value of "$(2r+q)/(2p+2q+2r)$" can be determined by measuring the imidization rate of a polyimide precursor followed by using the following equation.

$$(2r+q)/(2p+2q+2r) = \text{imidization rate}/100$$

The imidization rate of a polyimide precursor (the value of "$(2r+q)/(2p+2q+2r) \times 100$") is measured as below-mentioned.

First, $^1$H-NMR spectra of a polyimide precursor are measured. Subsequently, the integral value (denoted as ε) of the $^1$H peak of the amide group and the integral value (denoted as β) of the $^1$H peak of the amide group are determined, wherein the latter integral value is based on a ratio of 100:0:0 as the molar ratio of the repeating units represented by the chemical formula (1), chemical formula (3), and chemical formula (4) respectively contained in the polyimide precursor. That is, the calculation of the integral value of the $^1$H peak of the amide group on the assumption that the resin is in the non-imidized, completely polyamic acid state. The imidization rate can be determined using these β and ε in accordance with the following equation.

$$\text{Imidization rate} = (\beta - \varepsilon)/\beta \times 100$$

In this regard, β can be calculated using the following equation. In the following equation, α is an integral value of all $^1$H or specific $^1$H peaks included in A and B in the chemical formula (1), chemical formula (3), and chemical formula (4). ω is the number of the hydrogen atoms included in the calculation of α.

$$\beta = \alpha/\omega \times 2$$

A measurement sample for $^1$H-NMR is preferably a polyimide precursor alone, but may contain another resin component or solvent. It is preferable, however, that the peaks of the $^1$H atoms contained in the other components do not overlap the peak of the $^1$H atoms serving as a marker for calculating the imidization rate.

A resin (a) that is imidized preferably has an imide group concentration of 35 to 45 mass %. Having an imide group concentration of 35 mass % or more increases the effect that prevents cracks from being generated in an inorganic film laminated on the resin film. Having an imide group concentration of 45 mass % or less affords favorable storage stability to the resin composition.

As used herein, an "imide group concentration" refers to a mass ratio of the imide group to 100 mass % of the whole polyimide as a polyimide obtained by completely imidizing a polyimide precursor by heat treatment, chemical treatment, or the like. Specifically, the concentration can be indicated in accordance with the following equation using the total atomic weight (denoted as x) of all atoms included in the repeating unit of the polyimide and the total atomic weight (denoted as y) of the atoms included in the imide group in the repeating unit. In cases where a polyimide precursor contains a plurality of tetracarboxylic acid residues or a plurality of diamine residues, x can be calculated using a value obtained by multiplying the atomic weight of each tetracarboxylic acid residue or each diamine residue by the molar ratio at which each residue is contained.

$$\text{Imide group concentration} = y/x \times 100$$

For example, on the basis of 60 mol % of pyromellitic acid (PMDA) residue and 40 mol % of 3,3',4,4'-biphenyltetracarboxylic (BPDA) residue with respect to 100 mol % of tetracarboxylic acid residue, and in addition, 60 mol % of p-phenylene diamine (PDA) residue and 40 mol % of 4,4'-diaminodiphenyl ether (DAE) residue with respect to 100 mol % of diamine residue, the imide group concentration can be determined as below-mentioned. That is, $C_6H_2$ in the PMDA residue, $C_{12}H_6$ in the BPDA residue, $C_6H_4$ in the PDA residue, and $C_{12}H_8O$ in the DAE residue have an atomic weight (74.08, 150.18, 76.1, and 168.2 respectively); $C_4N_2O_4$ included in the imide group has an atomic weight (140.06); and these can be used to calculate x as follows: 74.08×0.6+150.18×0.4+76.1×0.6+168.2×0.4+ 140.06=357.52. y is the atomic weight (140.06) of $C_4N_2O_4$ included in the imide group. Accordingly, the imide group concentration is as follows: 140.06/357.52×100=39%.

In the resin (a), the chains may be terminated with end capping agents. Allowing the chain of the resin (a) to react with an end capping agent can serve to control the molecular weight of the polyimide precursor in a preferable range.

In cases where the polyimide precursor has a diamine compound as the terminal monomer, the amino group can be capped by using a dicarboxylic anhydride, monocarboxylic acid, monocarboxylic chloride compound, monocarboxylic acid active ester compound, dialkyl dicarbonate, or the like as an end capping agent. In cases where the polyimide precursor has a dianhydride as the terminal monomer, the dianhydride can be capped by using a monoamine, monoalcohol, or the like as an end capping agent.

In cases where the polyimide precursor is end-capped, the polyimide precursor (an example of the resin (a)) preferably has a structure represented by the chemical formula (8).

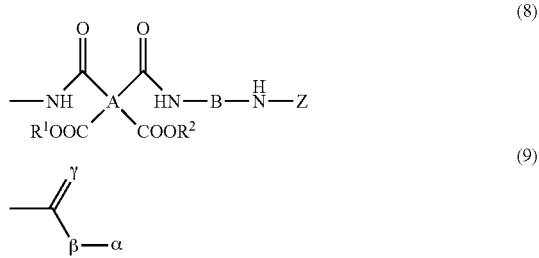

In the chemical formula (8), A represents a tetravalent tetracarboxylic acid residue having 2 or more carbon atoms; B represents a divalent diamine residue having 2 or more carbon atoms; Z represents an end structure of the resin, specifically a structure represented by the chemical formula (9); and $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion.

In the chemical formula (9), α represents a monovalent hydrocarbon group having 2 or more carbon atoms. α is preferably a monovalent hydrocarbon group having 2 to 10 carbon atoms. More preferably, a is an aliphatic hydrocarbon group. This aliphatic hydrocarbon group may be straight, branched, or cyclic. In the chemical formula (9), β and γ independently represent an oxygen atom or sulfur atom. β and γ are each preferably an oxygen atom.

Examples of such hydrocarbon groups include straight-chain hydrocarbon groups such as an ethyl group, n-propyl group, n-butyl group, n-pentyl group, n-hexyl group, n-heptyl group, n-octyl group, n-nonyl group, and n-decyl group; branched chain hydrocarbon groups such as an isopropyl group, isobutyl group, sec-butyl group, tert-butyl group, isopentyl group, sec-pentyl group, tert-pentyl group, isohexyl group, and sec-hexyl group; and cyclic hydrocarbon groups such as a cyclopropyl group, cyclobutyl group, cyclopentyl group, cyclohexyl group, cycloheptyl group, cyclooctyl group, norbornyl group, and adamantyl group.

Among these hydrocarbon groups, monovalent branched chain hydrocarbon groups and cyclic hydrocarbon groups having 2 to 10 carbon atoms are preferable, an isopropyl group, cyclohexyl group, tert-butyl group, and tert-pentyl group are more preferable, and a tert-butyl group is most preferable.

Heating a resin having a structure represented by the chemical formula (8) causes Z to be thermally decomposed, generating an amino group at an end of the resin. The amino group generated at an end can react with another resin having a tetracarboxylic acid at an end thereof. Thus, heating a resin having a structure represented by the chemical formula (8) can yield a polyimide resin having a high molecular weight.

The resin (a) preferably has a weight average molecular weight of 200,000 or less, more preferably 150,000 or less, and particularly preferably 100,000 or less, in terms of polystyrene as measured by gel permeation chromatography. The resin (a) having a weight average molecular weight in this range makes it possible that the viscosity of even the resin composition of high concentration is further prevented from increasing. In addition, the resin (a) preferably has a weight average molecular weight of 2,000 or more, more preferably 3,000 or more, and particularly preferably 5,000 or more. The resin (a) having a weight average molecular weight of 2,000 or more makes it possible that a resin composition formed therefrom does not have an excessively low viscosity and maintains higher coatability.

The repeating number of each of a repeating unit represented by the chemical formula (1), a repeating unit represented by the chemical formula (3), and a repeating unit represented by the chemical formula (4) needs only to be in a range that satisfies the above-mentioned weight average molecular weight. The lower limit of the repeating number of each of these is preferably 5 or more, more preferably 10 or more. The upper limit of the repeating number of each of these is preferably 1000 or less, more preferably 500 or less.

(Solvent)

A resin composition according to an embodiment of the present invention contains a solvent (b) and a solvent (c) as above-mentioned. The solvent (b) is a solvent having an SP value of 7.5 or more and less than 9.5. The solvent (c) is a solvent having an SP value of 9.5 or more and 14.0 or less.

The solvent (b) and the solvent (c) each having an SP value within the above-mentioned range enable a resin film obtained therefrom to have excellent mechanical characteristics and enable cracks to be prevented from being generated in an inorganic film laminated on the resin film. In addition, the resulting resin composition has excellent storage stability.

The solvent (b) contained in a resin composition according to an embodiment of the present invention is preferably a solvent containing a compound having a structure represented by the chemical formula (2), from the viewpoint of the in-plane uniformity of the resulting resin film.

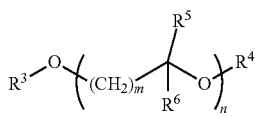

(2)

In the chemical formula (2), m and n independently represent a positive integer of 1 to 5. $R^3$ to $R^6$ independently represent a hydrogen atom, a hydrocarbon group having 1 to 10 carbon atoms, or an acyl group having 1 to 10 carbon atoms.

Specific examples of the solvent (b) are listed as below-mentioned. Examples of compounds having a structure represented by the chemical formula (2) included in the solvent (b) include dimethyl glycol (having an SP value of 7.6), dimethyl diglycol (having an SP value of 8.1), dimethyl triglycol (having an SP value of 8.4), methylethyl diglycol (having an SP value of 8.1), diethyl diglycol (having an SP value of 8.2), dibutyl diglycol (having an SP value of 8.3), ethylene glycol diethyl ether (having an SP value of 7.9), ethylene glycol monoethyl ether acetate (having an SP value of 8.9), diethylene glycol monobutyl ether acetate (having an SP value of 8.9), diethylene glycol monoethyl ether acetate (having an SP value of 9.0), ethylene glycol monobutyl ether acetate (having an SP value of 8.8), dipropylene glycol dimethyl ether (having an SP value of 7.9), propylene glycol monomethyl ether acetate (having an SP value of 8.7), dipropylene glycol methyl ether acetate (having an SP value of 8.7), dipropylene glycol methyl propyl ether (having an SP value of 8.0), dipropylene glycol butyl ether (having an SP value of 9.4), tripropylene glycol methyl ether (having an SP value of 9.4), tripropylene glycol butyl ether (having an SP value of 9.3), 3-methoxybutyl acetate (having an SP value of 8.7), 3-methoxy-3-methyl-1-butyl acetate (having an SP value of 8.5), and the like.

Examples of compounds (included in the solvent (b)) other than compounds having a structure represented by the chemical formula (2) include methyl acetate (having an SP value of 8.8), ethyl acetate (having an SP value of 8.7), isopropyl acetate (having an SP value of 8.5), n-propyl acetate (having an SP value of 8.7), butyl acetate (having an SP value of 8.7), cyclohexyl acetate (having an SP value of 9.2), methylethyl ketone (having an SP value of 9.0), acetone (having an SP value of 9.1), diisobutyl ketone (having an SP value of 8.5), toluene (having an SP value of 9.1), xylene (having an SP value of 9.1), tetrahydrofuran (having an SP value of 8.3), 2-methyl tetrahydrofuran (having an SP value of 8.1), 1,4-dioxane (having an SP value of 8.6), anisole (having an SP value of 9.4), and the like.

The solvent (b) has an SP value of 7.5 or more and less than 9.5, and from the viewpoint of storage stability, this SP value is preferably 7.7 or more, more preferably 8.0 or more, still more preferably 8.2 or more. From the viewpoint of preventing an inorganic film from generating cracks, this SP value is preferably 9.3 or less, more preferably 9.1 or less, still more preferably 8.9 or less. Other preferable ranges may be found by arbitrarily combining the upper and lower limit values given above. Thus, the SP value is also preferably in the range of 8.0 or more and 8.9 or less.

Specific examples of the solvent (c) are listed as below-mentioned. Examples thereof include N-methylpyrrolidone (having an SP value of 11.5), N-ethylpyrrolidone (having an SP value of 11.1), N,N-dimethylacetamide (having an SP value of 10.6), N,N-dimethylformamide (having an SP value of 10.6), N,N-diethylacetamide (having an SP value of 10.1), N,N-diethylformamide (having an SP value of 10.1), 3-methoxy-N,N-dimethylpropionamide (having an SP value of 10.3), 3-n-butoxy-N,N-dimethylpropionamide (having an SP value of 9.8), N,N-dimethyl isobutylamide (having an SP value of 9.9), 1,3-dimethyl-2-imidazolidinone (having an SP value of 9.9), N,N-dimethylpropyleneurea (having an SP value of 9.7), dimethyl sulfoxide (having an SP value of 13.2), N-methyl-2-oxazolidinone (having an SP value of 12.2), δ-valerolactone (having an SP value of 9.7), γ-valerolactone (having an SP value of 9.5), γ-butyrolactone (having an SP value of 9.9), cyclohexanone (having an SP value of 9.8), diethylene glycol monoethyl ether (having an SP value of 10.1), ethylene glycol monoethyl ether (having an SP value of 10.4), diethylene glycol monobutyl ether (having an SP value of 9.9), ethylene glycol monobutyl ether (having an SP value of 10.0), propylene glycol diacetate (having an SP value of 9.6), propylene glycol methyl ether (having an SP value of 10.2), propylene glycol propyl ether (having an SP value of 9.8), propylene glycol butyl ether (having an SP value of 9.7), propylene glycol phenyl ether (having an SP value of 11.1), dipropylene glycol methyl ether (having an SP value of 9.7), dipropylene glycol propyl ether (having an SP value of 9.5), 1,4-butane diol diacetate (having an SP value of 9.6), 1,3-butylene glycol diacetate (having an SP value of 9.5), 1,6-hexane diol diacetate (having an SP value of 9.5), 3-methoxy butanol (having an SP value of 10.0), 1,3-butylene glycol (having an SP value of 12.8), 3-methoxy-3-methyl-1-butanol (having an SP value of 9.6), methanol (having an SP value of 11.7), ethanol (having an SP value of 11.0), n-propyl alcohol (having an SP value of 10.5), isopropyl alcohol (having an SP value of 10.2), ethyl lactate (having an SP value of 11.0), butyl lactate (having an SP value of 10.8), butyl benzoate (having an SP value of 9.8), diacetone alcohol (having an SP value of 10.9), and the like.

The solvent (c) has an SP value of 9.5 or more and less than 14.0, and from the viewpoint of the storage stability of the resin composition, this SP value is preferably 9.7 or more, more preferably 10.0 or more, still more preferably 10.3 or more. In addition, this SP value is preferably 13.7 or less, more preferably 13.5 or less, still more preferably 13.2 or less. Other preferable ranges may be found by arbitrarily combining the upper and lower limit values given above. Thus, the SP value is also preferably in the range of 9.7 or more and 13.2 or less.

The solvent (b) and solvent (c) contained in a resin composition according to an embodiment of the present invention are preferably characterized as below-mentioned. Specifically, the boiling point of the solvent of the solvents (c) which has the lowest boiling point is preferably 10° C. or more, more preferably 15° C. or more, higher than the boiling point of the solvent of the solvents (b) which has the highest boiling point. Such a difference of 10° C. or more in boiling point allows the solvent (c) having low resin solubility to be dried earlier than the solvent (b), thus making it possible to prevent the resin from agglomerating and accordingly having lower in-plane uniformity.

The amount of the solvent (b) contained in a resin composition according to an embodiment of the present invention is preferably 5 to 60 mass %, more preferably 10 to 50 mass %, still more preferably 15 to 40 mass %, with respect to 100 mass % of all solvents (specifically, all solvents including the solvent (b) and the solvent (c)) contained in this resin composition. The solvent (b) in an amount of 5 mass % or more allows a sufficient coating to be formed and affords a resin film having excellent mechanical characteristics. The solvent (b) in an amount of 60 mass % or less allows the resin composition to have excellent storage stability.

The amount of the solvent (c) contained in a resin composition according to an embodiment of the present invention is preferably 40 to 95 mass %, more preferably 50 to 90 mass %, still more preferably 60 to 85 mass %, with respect to 100 mass % of all solvents contained in this resin composition. The solvent (c) in an amount of 40 mass % or more allows the resin composition to have excellent storage stability. The solvent (c) in an amount of 95 mass % or less allows a sufficient coating to be formed and affords a resin film having excellent mechanical characteristics.

For the resin composition according to an embodiment of the present invention, the concentration of the resin (a) is preferably 3 mass % or more, more preferably 5 mass % or more, with respect to 100 mass % of the resin composition. In addition, the concentration of the resin (a) is preferably 40 mass % or less, more preferably 30 mass % or less. The resin (a) contained at a concentration of 3 mass % or more makes it easy for the resin film to have a larger film thickness. The resin (a) contained at a concentration of 40 mass % or less is dissolved sufficiently, making it easier to obtain a uniform resin film.

The resin composition according to an embodiment of the present invention preferably has a viscosity of 20 to 13,000 mPa·s, more preferably 50 to 8,000 mPa·s. The resin composition having a viscosity of less than 20 mPa·s fails to afford a resin film having a sufficient film thickness. The resin composition having a viscosity of more than 13,000 mPa·s makes it difficult to apply the varnish.

(Additives)

A resin composition according to an embodiment of the present invention may contain at least one additive selected from the following: photoacid generating agents (d), thermal crosslinking agents (e), thermal acid generating agents (f), compounds containing a phenolic hydroxy group (g), adhesion improving agents (h), inorganic particles (i), and surface active agents (j).

(Photoacid Generating Agent (d))

A resin composition according to an embodiment of the present invention can contain a photoacid generating agent (d) to be formed into a photosensitive resin composition. Containing such a photoacid generating agent (d) allows acid to be generated in light-irradiated portions of the resin composition so that these light-irradiated portions can increase in solubility in aqueous alkali solutions, resulting in a positive type relief pattern in which the light-irradiated portions are dissolvable. The resin composition containing the photoacid generating agent (d) and an epoxy compound or such a thermal crosslinking agent (e) as described later allows the acid generated in the light-irradiated portions to promote the crosslinking reaction of the epoxy compound or thermal crosslinking agent (e), resulting in a negative type relief pattern in which the light-irradiated portions are insolubilized.

Examples of such photoacid generating agents (d) include quinone diazide compounds, sulfonium salts, phosphonium salts, diazonium salts, and iodonium salts. The resin composition may contain two or more of these agents, and thus, enables a photosensitive resin composition having high sensitivity to be obtained.

Of the examples of photoacid generating agents (d), sulfonium salts, phosphonium salts, and diazonium salts are preferable because they can moderately stabilize the acid component produced by light exposure. Among others, sulfonium salts are preferable. The resin composition can further contain a sensitization agent and the like, if necessary, in addition to the photoacid generating agent (d).

For the present invention, the amount of the photoacid generating agent (d) is preferably 0.01 to 50 parts by mass with respect to 100 parts by mass of the resin (a) from the viewpoint of increasing the sensitivity. The amount of the quinone diazide compound among the above-mentioned agents is preferably 3 to 40 parts by mass. In addition, the total amount of sulfonium salt, phosphonium salt, and diazonium salt is preferably 0.5 to 20 parts by mass.

(Thermal Crosslinking Agent (e))

A resin composition according to an embodiment of the present invention may contain a thermal crosslinking agent represented by the chemical formula (31) given below or a thermal crosslinking agent having a structure represented by the chemical formula (32) given below (hereinafter, collectively referred to as a thermal crosslinking agent (e)). The thermal crosslinking agent (e) can crosslink polyimide or a precursor thereof and another additive component, thus enhancing the chemical resistance and hardness of the obtained resin film.

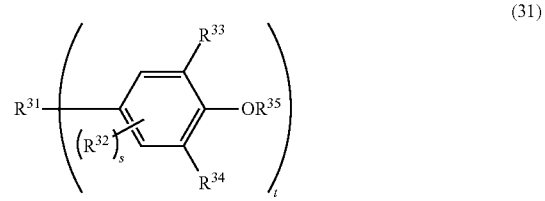

(31)

In the above-mentioned chemical formula (31), $R^{31}$ represents a di- to tetra-valent linking group. $R^{32}$ represents a monovalent hydrocarbon group having 1 to 20 carbon atoms, Cl, Br, I, or F. $R^{33}$ and $R^{34}$ independently represent $CH_2OR^{36}$ wherein $R^{36}$ is a hydrogen atom or a monovalent hydrocarbon group having 1 to 6 carbon atoms. $R^{35}$ represents a hydrogen atom, methyl group, or ethyl group. s is an integer of 0 to 2, and t is an integer of 2 to 4. In cases where a plurality of $R^{32}$ groups exist, they may be the same or different. In cases where a plurality of $R^{33}$ and $R^{34}$ groups exist, they may be the same or different. In cases where a plurality of $R^{35}$ groups exist, they may be the same or different. Examples of the linking group $R^{31}$ are listed below.

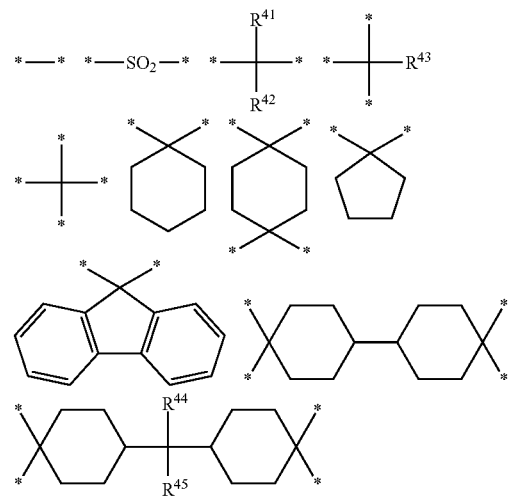

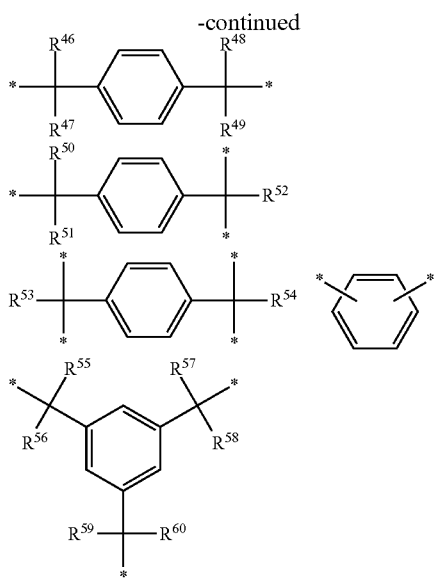

In the chemical formulae, $R^{41}$ to $R^{60}$ each represent a hydrogen atom or a monovalent hydrocarbon group having 1 to 20 carbon atoms in which one or more of the hydrogen atoms may be substituted with Cl, Br, I, or F. The symbol * represents the bonding points of $R^{31}$ in the chemical formula (31) in cases where the thermal crosslinking agent (e) is represented by the chemical formula (31).

$$—N(CH_2OR^{37})_u(H)_v \quad (32)$$

In the above-mentioned chemical formula (32), $R^{37}$ represents a hydrogen atom or a monovalent hydrocarbon group having 1 to 6 carbon atoms. In addition, u represents an integer of 1 or 2, and v represents an integer of 0 or 1. Here, u+v is equal to 1 or 2. The symbol * in the above-mentioned chemical formula represents the bonding point between the nitrogen atom in the chemical formula (32) and another atom in cases where the thermal crosslinking agent (e) contains a structure represented by the chemical formula (32).

In the chemical formula (31) given above, $R^{33}$ and $R^{34}$ each represent $CH_2OR^{36}$, which is a thermal crosslinking group. $R^{36}$ is preferably a monovalent hydrocarbon group having 1 to 4 carbon atoms, more preferably a methyl group or ethyl group, to allow the thermal crosslinking agent represented by the chemical formula (31) to maintain a moderate degree of reactivity and high storage stability. Preferable examples of thermal crosslinking agents containing a structure represented by the chemical formula (31) are listed below.

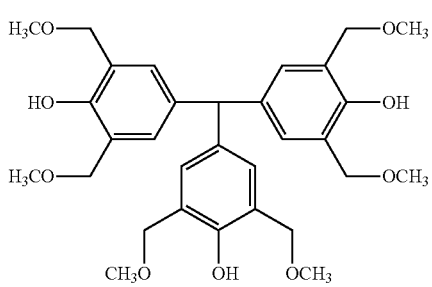

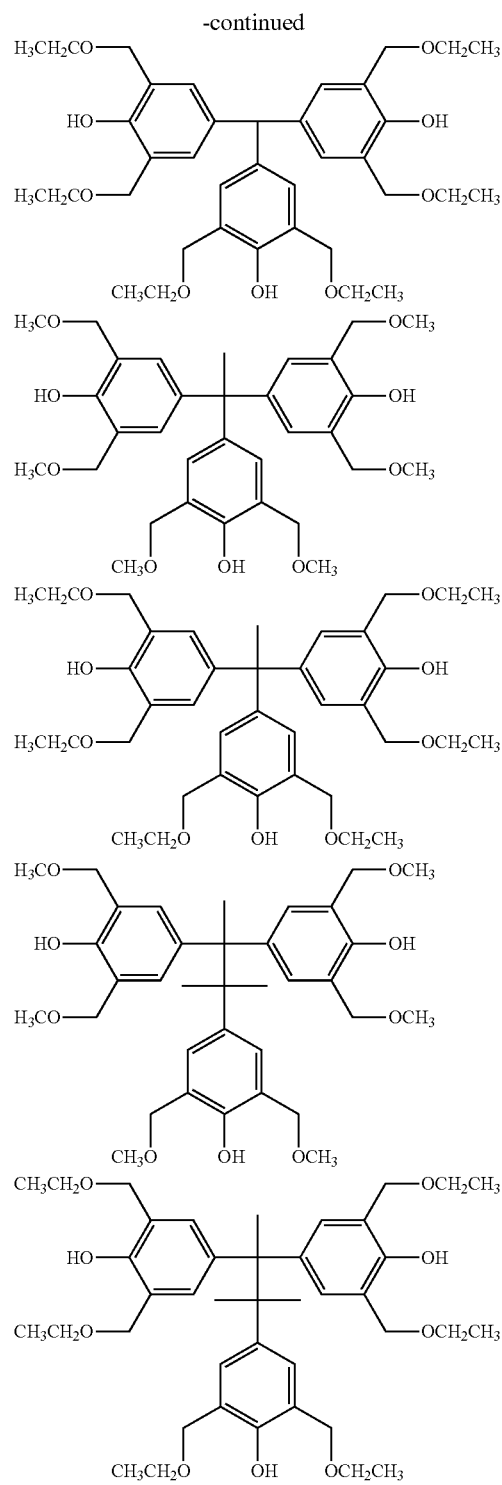

In the chemical formula (32), $R^{37}$ is preferably a monovalent hydrocarbon group having 1 to 4 carbon atoms. Furthermore, from the viewpoint of the stability of the compound and the storage stability of the photosensitive resin composition, $R^{37}$ is preferably a methyl group or ethyl group, and the compound more preferably contains 8 or less ($CH_2OR^{37}$) groups. Preferable examples of thermal crosslinking agents containing a group represented by the chemical formula (32) are listed below.

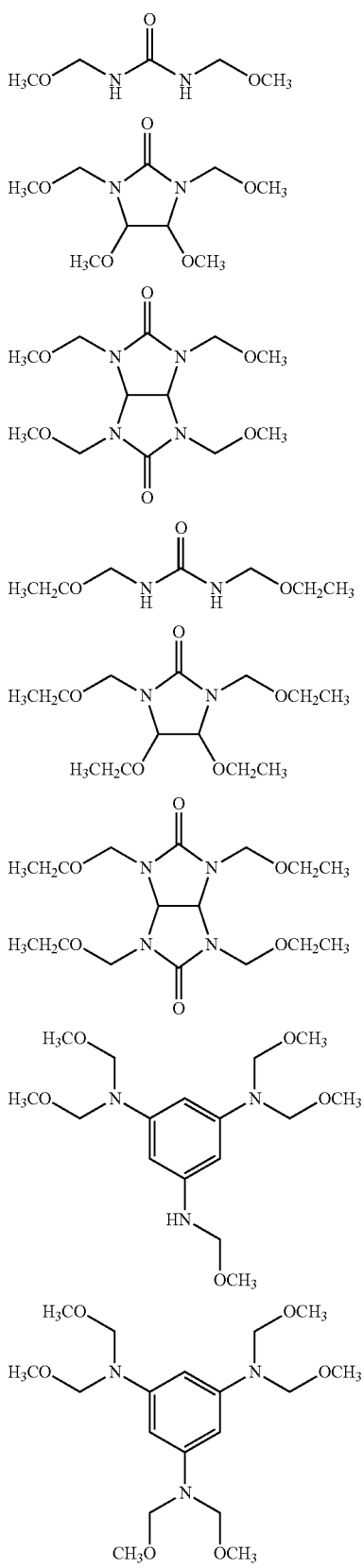

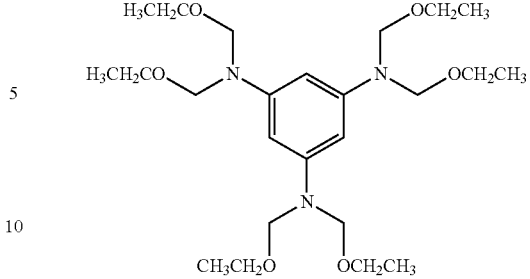

In the present invention, the amount of the thermal crosslinking agent (e) is preferably 10 parts by mass or more and 100 parts by mass or less with respect to 100 parts by mass of the resin (a). The thermal crosslinking agent (e) in an amount of 10 parts by mass or more and 100 parts by mass or less allows the resulting resin film to have high strength and allows the resin composition to have excellent storage stability.

(Thermal Acid Generating Agent (f))

A resin composition according to an embodiment of the present invention may further contain a thermal acid generating agent (f). A thermal acid generating agent (f) generates an acid when heated after development as described below to promote the crosslinking reaction between the polyimide or a precursor thereof and the thermal crosslinking agent (e) and also promote the curing reaction. This makes it possible that the chemical resistance of the resulting resin film is enhanced, and that the film loss is reduced. The acid generated by the thermal acid generating agent (f) is preferably a strong acid, which is preferably an aryl sulfonic acid such as p-toluene sulfonic acid or benzene sulfonic acid, or an alkyl sulfonic acid such as methane sulfonic acid, ethane sulfonic acid, or butane sulfonic acid. For the present invention, the thermal acid generating agent (f) preferably contains an aliphatic sulfonic acid compound represented by the chemical formula (33) or the chemical formula (34), and may contain two or more of such compounds.

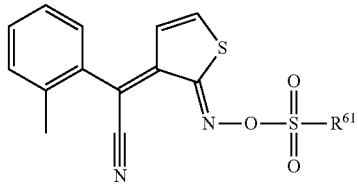
(33)

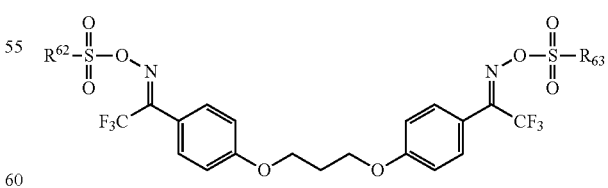
(34)

In the chemical formula (33) and the chemical formula (34) given above, $R^{61}$ to $R^{63}$, which may be the same or different, each represents an organic group having 1 to 20 carbon atoms. $R^{61}$ to $R^{63}$ are each preferably a hydrocarbon group having 1 to 20 carbon atoms. In addition, $R^{61}$ to $R^{63}$ may be organic groups each having 1 to 20 carbon atoms and containing atoms of hydrogen and carbon as essential elements and atoms of one or more elements selected from the group of boron, oxygen, sulfur, nitrogen, phosphorus, silicon, and halogens.

Specific examples of such compounds represented by the chemical formula (33) are listed below.

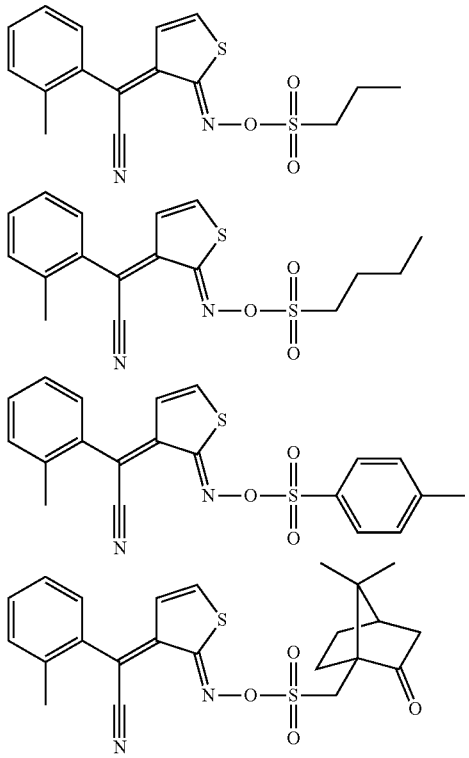

Specific examples of such compounds represented by the chemical formula (34) are listed below.

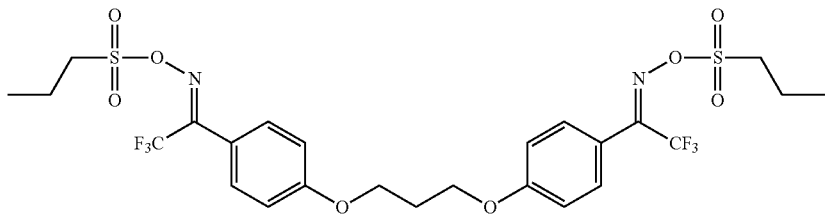 [SMILES: CCCS(=O)(=O)O/N=C(/c1ccc(OCCCOc2ccc(/C(=N/OS(=O)(=O)CCC)C(F)(F)F)cc2)cc1)C(F)(F)F]

In the present invention, the amount of the thermal acid generating agent (f) is preferably 0.5 parts by mass or more, preferably 10 parts by mass or less, with respect to 100 parts by mass of the resin (a), from the viewpoint of promoting the crosslinking reaction.

(Compound Containing Phenolic Hydroxy Group (g))

For a resin composition according to an embodiment of the present invention, the photosensitive resin composition may contain a compound having a phenolic hydroxy group (g), if necessary, with a view to helping the alkaline development thereof. Examples of such compounds having a phenolic hydroxy group (g) include: the products available from Honshu Chemical Industry Co., Ltd., under the following trade names: Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylene tris-FR-CR, BisRS-26X, and BisRS-OCHP; the products available from Asahi Organic Chemicals Industry Co., Ltd., under the following trade names: BIR-OC, BIP-PC, BIR-PC, BIR-PTBP, BIR-PCHP, BIP-BIOC-F, 4PC, BIR-BIPC-F, and TEP-BIP-A; and others including 1,4-dihydroxy naphthalene, 1,5-dihydroxy naphthalene, 1,6-dihydroxy naphthalene, 1,7-dihydroxy naphthalene, 2,3-dihydroxy naphthalene, 2,6-dihydroxy naphthalene, 2,7-dihydroxy naphthalene, 2,4-dihydroxy quinoline, 2,6-dihydroxy quinoline, 2,3-dihydroxy quinoxaline, anthracene-1,2,10-triol, anthracene-1,8,9-triol, and 8-quinolinol. If such a compound having a phenolic hydroxy group (g) is contained, the resulting photosensitive resin composition will be scarcely dissolved in an alkaline developer before light exposure, but will be easily dissolved in an alkaline developer after light exposure, leading to a decreased film loss during development and ensuring rapid and easy development. Accordingly, the sensitivity can be enhanced easily.

In the present invention, the amount of such a compound having a phenolic hydroxy group (g) is preferably 3 parts by mass or more and 40 parts by mass or less with respect to 100 parts by mass of the resin (a).

(Adhesion Improving Agent (h))

A resin composition according to an embodiment of the present invention may contain an adhesion improving agent (h). Examples of adhesion improving agents (h) include silane coupling agents such as vinyl trimethoxysilane, vinyl triethoxysilane, 2-(3,4-epoxy cyclohexyl) ethyl trimethoxysilane, 3-glycidoxypropyl methyl dimethoxy silane, 3-glycidoxypropyl trimethoxysilane, 3-glycidoxypropyl methyl diethoxy silane, 3-glycidoxypropyl triethoxysilane, p-styryl trimethoxysilane, 3-methacryloxypropyl trimethoxysilane, 3-methacryloxypropylmethyl diethoxysilane, 3-methacryloxypropyl triethoxysilane, 3-aminopropyl trimethoxysilane, 3-aminopropyl triethoxy silane, N-2-(aminoethyl)-3-aminopropyl trimethoxysilane, N-phenyl-3-aminopropyl trimethoxysilane, tris-(trimethoxy silylpropyl) isocyanurate, 3-ureidopropyl triethoxysilane, 3-ureidopropyl trimethoxysilane, 3-ureidopropyl methoxydiethoxy silane, 3-ureidopropyl dimethoxyethoxysilane, 3-isocyanate propyl triethoxysilane, and 3-trimethoxysilyl propylsuccinic anhydride. In addition, the adhesion improving agent (h) may also contain a siloxane oligomer having a functional group such as alkoxy group, amino group, epoxy group, or ureido group, or contain an organic polymer having a functional group such as an alkoxysilyl group, amino group, epoxy group, or ureido group. Alternatively, the adhesion improving agent (h) may contain an alkoxysilane-containing aromatic amine compound or an alkoxysilane-containing aromatic amide compound as shown below.

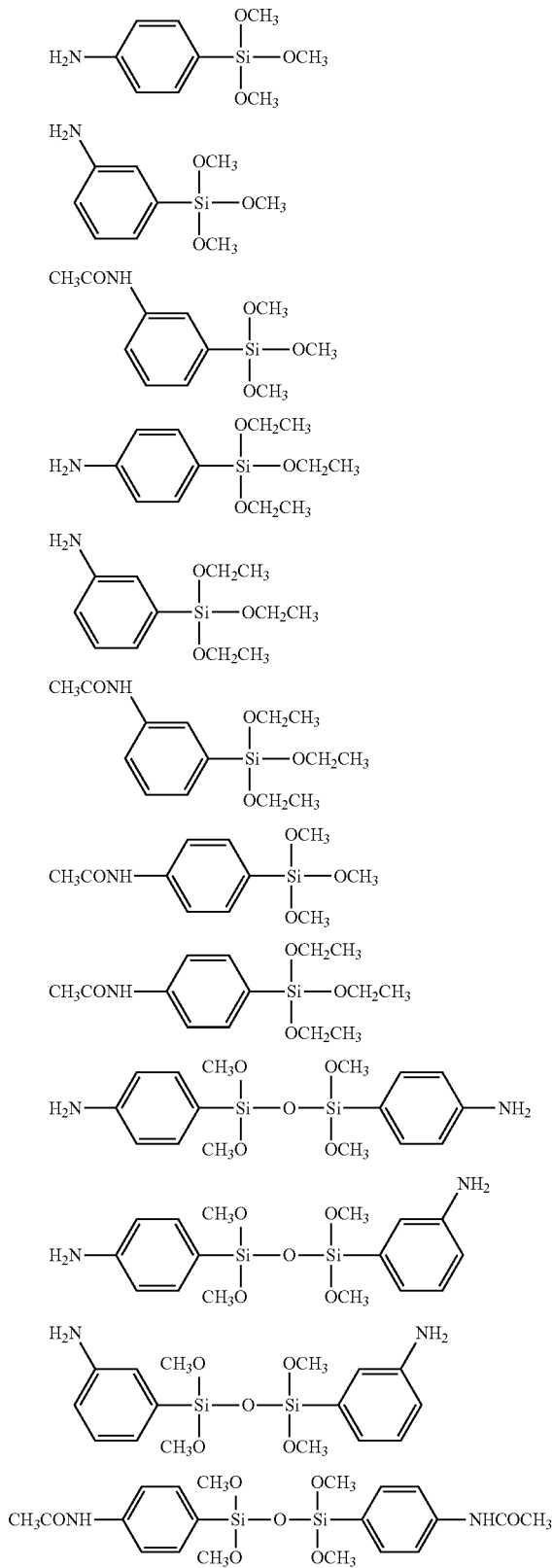
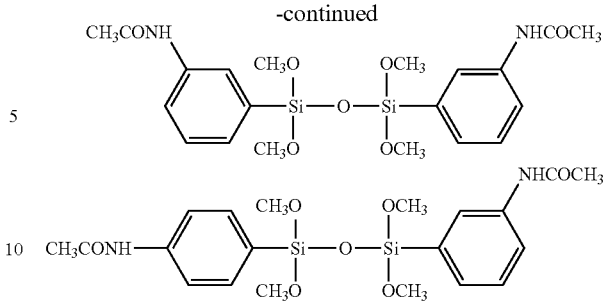

In addition, compounds produced through a reaction between an aromatic amine compound and an alkoxy-containing silicon compound can also be used as adhesion improving agents (h). Examples of such compounds include those produced by allowing an aromatic amine compound react with an alkoxysilane compound having a group reactive with an amino group such as an epoxy group or chloromethyl group. A resin composition according to an embodiment of the present invention may contain two or more of the above-mentioned adhesion improving agents (h). Containing such an adhesion improving agent (h) makes it possible that a photosensitive resin film used for development has higher adhesion to an underlying base material such as a silicon wafer, ITO, $SiO_2$, or silicon nitride. In addition, the higher adhesion between a resin film and an underlying base material can enhance resistance to oxygen plasma used for cleaning and the like and to UV ozone processing. In addition, such higher adhesion can prevent a film lifting phenomenon in which a resin film is lifted from a substrate in vacuum processes during firing or during display production. In the present invention, the amount of the adhesion improving agent (h) is preferably 0.005 to 10 mass % with respect to 100 mass % of the resin (a).

(Inorganic Particles (i))

A resin composition according to an embodiment of the present invention may contain inorganic particles (i) with a view to enhancing the heat resistance. Examples of inorganic particles (i) to be used for this purpose include: metal inorganic particles such as of platinum, gold, palladium, silver, copper, nickel, zinc, aluminum, iron, cobalt, rhodium, ruthenium, tin, lead, bismuth, and tungsten; and metal oxide inorganic particles such as of silicon oxide (silica), titanium oxide, aluminum oxide, zinc oxide, tin oxide, tungsten oxide, zirconium oxide, calcium carbonate, and barium sulfate. There are no specific limitations on the shape of these inorganic particles (i), and they may be spherical, elliptic, flattened, rod-like, fibrous, or the like. To prevent an increase in the surface roughness of a resin film containing inorganic particles (i), the average particle diameter of the inorganic particles (i) is preferably 1 nm or more and 100 nm or less, more preferably 1 nm or more and 50 nm or less, and still more preferably 1 nm or more and 30 nm or less.

In the present invention, the amount of the inorganic particles (i) is preferably 3 parts by mass or more, more preferably 5 parts by mass or more, still more preferably 10 parts by mass or more, with respect to 100 parts by mass of the resin (a). In addition, the amount of the inorganic particles (i) is preferably 100 parts by mass or less, more preferably 80 parts by mass or less, still more preferably 50 parts by mass or less. The inorganic particles (i) in an amount of 3 parts by mass or more allows the heat resistance of the resin composition to be enhanced sufficiently. The inorganic particles (i) in an amount of 100 parts by mass or less allows the toughness of the resin film to be less likely to decrease.

(Surface Active Agent (j))

The resin composition according to an embodiment of the present invention may contain a surface active agent (j) in order to enhance the coatability. Examples of surface active agents (j) include fluorochemical surface active agents such as "Fluorad" (registered trademark) manufactured by Sumitomo 3M, "Megafac" (registered trademark) manufactured by DIC Corporation, "Surflon" (registered trademark) manufactured by Asahi Glass Co., Ltd.; organic siloxane surface active agents such as KP341 manufactured by Shin-Etsu Chemical Co., Ltd., DBE manufactured by Chisso Corporation, "Polyflow" (registered trademark) and "Glanol" (registered trademark) manufactured by Kyoeisha Chemical Co., Ltd., and BYK manufactured by BYK-Chemie; and acrylic polymer surface active agents such as Polyflow manufactured by Kyoeisha Chemical Co., Ltd. The amount of such a surface active agent (j) is preferably 0.01 to 10 parts by mass with respect to 100 parts by mass of the resin (a).

(Method of Producing Resin Composition)

Next, a method of producing a resin composition according to an embodiment of the present invention will be described. In the method of producing a resin composition, a polyimide precursor (an example of the resin (a)) and, if necessary, a photoacid generating agent (d), thermal cross-linking agent (e), thermal acid generating agent (f), compound containing a phenolic hydroxy group (g), adhesion improving agent (h), inorganic particles (i), surface active agent (j), and/or the like are dissolved in a solvent (containing the solvent (b) and the solvent (c)). This affords a varnish, which is one of the resin compositions according to an embodiment of the present invention. The dissolution can be carried out by stirring, heating, or the like. In cases where a photoacid generating agent (d) is contained, an appropriate heating temperature is adopted in a range, commonly from room temperature to 80° C., where a photosensitive resin composition with unimpaired performance is obtained. There are no specific limitations on the order of dissolving these components, and for example, the compound with the lowest solubility may be dissolved first followed by the others in the order of solubility. Further, the dissolution of those components, such as a surface active agent, that are likely to form bubbles when dissolved by stirring may be preceded by the dissolution of the other components so that the dissolution of the latter will not be hindered by bubble formation.

The polyimide precursor can be polymerized by a known method. For example, a polyamic acid can be produced by polymerizing an acid component, such as a tetracarboxylic acid or the corresponding acid dianhydride, active ester, and active amide, with a diamine component, such as a diamine or the corresponding trimethylsilylated diamine, in a reaction solvent. Moreover, the carboxyl group in the polyamic acid may be in a salified state with an alkali metal ion, ammonium ion, or imidazolium ion or in an esterified state with a hydrocarbon group having 1 to 10 carbon atoms or an alkylsilyl group having 1 to 10 carbon atoms.

Examples of reaction solvents include the solvents described as specific examples of solvents (b) and solvents (c), wherein the solvents are each used singly or are used in mixture of two or more thereof. It is preferable for the amount of the reaction solvent to be adjusted so that the tetracarboxylic acid and diamine compound altogether can account for 0.1 to 50 mass % of the total amount of the reaction solution. In addition, the reaction temperature is preferably −20° C. to 150° C., more preferably 0 to 100° C. Furthermore, the reaction time is preferably 0.1 to 24 hours, more preferably 0.5 to 12 hours. In addition, it is preferable that the diamine compound and tetracarboxylic acid that are used in the reaction have the same number of moles. These having the same number of moles makes it possible that a resin film having good mechanical characteristics can be obtained easily from the resin composition.

The resulting polyamic acid solution may be used directly as a resin composition according to an embodiment of the present invention. In this case, a resin composition of interest can be obtained without isolating the resin if the same solvent as intended for the resin composition is used as the reaction solvent, or the solvent is added after the completion of the reaction.

In addition, part of the repeating units of the resulting polyamic acid may further be imidized or esterified. In this case, the polyamic acid solution resulting from polymerization of a polyamic acid may be used directly in a subsequent reaction, or the polyamic acid that is isolated may be used for a subsequent reaction.

Also in the esterification reaction and imidization reaction of the polyamic acid, a resin composition of interest can be obtained without isolating the resin if the same solvent as intended for the resin composition is used as the reaction solvent or the solvent is added after the completion of the reaction.

A method of imidization is preferably a method in which a polyamic acid is heated or a method in which a dehydrator and an imidization catalyst are added to a polyamic acid, followed by heating the resulting mixture, if necessary. The former method is more preferable because the latter method requires a step of removing the reactant of the dehydrator, the imidization catalyst, and the like.

Examples of dehydrators that can be used include anhydrides such as acetic anhydride, propionic anhydride, and trifluoroacetic anhydride. Examples of imidization catalysts that can be used include tertiary amines such as 1-methyl imidazole, 2-methyl imidazole, 1,2-dimethyl imidazole, pyridine, collidine, lutidine, and triethyl amine.

The amount of the dehydrator and imidization catalyst is preferably adjusted appropriately depending on the intended degree of imidization. Examples of reaction solvents to be used for the imidization include those listed for the polymerization reaction.

The reaction temperature for the imidization reaction is preferably 0° C. to 180° C., more preferably 10° C. to 150° C. The reaction time is preferably 1.0 to 120 hours, more preferably 2.0 to 30 hours. Setting an appropriate reaction temperature and reaction time in these ranges ensures a desired degree of imidization of the polyamic acid.

The method of esterification is preferably a method in which an esterifying agent is used for the reaction, or a method in which sec-hexyl alcohol, cyclopropyl alcohol, cyclobutyl alcohol, cyclopentyl alcohol, cyclohexyl alcohol, cycloheptyl alcohol, cyclooctyl alcohol, norbornyl alcohol, adamantyl alcohol, or the like is used in the presence of a dehydration condensation agent. Examples of reaction solvents to be used for the esterification include those listed for the polymerization reaction.

The reaction temperature for the esterification reaction is preferably 0° C. to 80° C., more preferably 10° C. to 60° C. The reaction time is preferably 0.1 to 20 hours, more preferably 0.5 to 5 hours. Setting an appropriate reaction temperature and reaction time in these ranges ensures a desired degree of esterification of the polyamic acid.

A resin (a) having a capped end can be produced by allowing an end capping agent to react with a monomer before polymerization or to react with a resin (a) during polymerization and after polymerization. For example, the resin (a) having a structure represented by the above-mentioned chemical formula (8) can be produced by either of the following two methods.

The first production method is a method in which a resin having a structure represented by the chemical formula (8) is produced by the below-mentioned 2-step approach. Specifically, in the first step in this production method, a compound represented by the chemical formula (41) is generated by allowing a diamine compound to react with a compound (hereinafter referred to as an end amino group capping agent) that reacts with the amino group of the diamine compound to generate a compound represented by the chemical formula (41). In the subsequent second step, a resin having a structure represented by the chemical formula (8) is produced by allowing a compound represented by the chemical formula (41), a diamine compound, and a tetracarboxylic acid to react with one another.

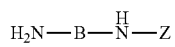

(41)

In the chemical formula (41), B represents a divalent diamine residue having 2 or more carbon atoms. Z is a structure represented by the chemical formula (9).

The second production method is a method in which a resin having a structure represented by the chemical formula (8) is produced by the below-mentioned 2-step approach. Specifically, in the first step in this production method, a resin having a structure represented by the chemical formula (42) is generated by allowing a diamine compound to react with a tetracarboxylic acid. In the second step, a resin having a structure represented by the chemical formula (8) is produced by allowing a resin having a structure represented by the chemical formula (42) to react with an end amino group capping agent.

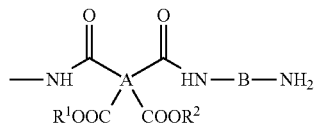

(42)

In the chemical formula (42), A represents a tetravalent tetracarboxylic acid residue having 2 or more carbon atoms; B represents a divalent diamine residue having 2 or more carbon atoms; and $R^1$ and $R^2$ independently represent a hydrogen atom, hydrocarbon group having 1 to 10 carbon atoms, alkylsilyl group having 1 to 10 carbon atoms, alkali metal ion, ammonium ion, imidazolium ion, or pyridinium ion.

A varnish obtained by these production methods is preferably filtered through a filter to remove foreign matters such as dusts. Filters with a pore size of, for example, 10 μm, 3 μm, 1 μm, 0.5 μm, 0.2 μm, 0.1 μm, 0.07 μm, or 0.05 μm are available, though there are no specific limitations about the size. The filter to be used for the filtration may be of such a material as polypropylene (PP), polyethylene (PE), nylon (NY), or polytetrafluoroethylene (PTFE), of which polyethylene and nylon are preferable.

(Resin Film and Method of Producing the Same)

Next, a resin film according to an embodiment of the present invention will be described. A resin film according to an embodiment of the present invention is a resin film for display substrates which contains, as a main component, a repeating unit represented by the chemical formula (4), wherein the ratio of the CTE (A) of a first resin film to the CTE (B) of a second resin film is (A):(B)=1.0:1.3 to 1.0:2.0, wherein the first resin film is obtained by etching one face of the resin film in the film thickness direction to reduce the film thickness to half, and wherein the second resin film is obtained by etching the other face of the resin film to reduce the film thickness to half. As used herein, a "main component" refers to a component that accounts for 50 mol % or more of all repeating units contained in the resin.

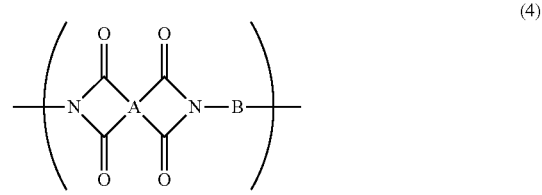

(4)

wherein, in the chemical formula (4), A represents a tetravalent tetracarboxylic acid residue having 2 or more carbon atoms. B represents a divalent diamine residue having 2 or more carbon atoms.

Having the ratio of the CTE (A) to the CTE (B) within the above-mentioned range enables the resin film to have excellent mechanical characteristics, enables cracks to be prevented from being generated in an inorganic film laminated on the resin film, and enables a display substrate having excellent flex resistance and reliability to be obtained.

The CTE (A) and CTE (B) are determined by the following method. First, a resin film is adhered to a glass substrate, and the resulting piece is subjected to plasma etching treatment on the resin film side using oxygen gas. The etching treatment is carried out until the original value of the film thickness of the resin film is reduced to half. After the etching treatment, the resin film is detached from the support, followed by measuring the CTE by the below-mentioned method. In addition, a resin film adhered to the opposite side of the glass substrate is subjected to etching treatment and CTE measurement in the same manner. Of the CTE measurements, the smaller value is regarded as a CTE (A), and the larger value is regarded as a CTE (B).

In this regard, a CTE as used herein refers to a coefficient of thermal linear expansion of a resin film in the in-plane direction, and can be determined by the following method. That is, a thermomechanical analyzer (for example, EXSTAR6000 TMA/SS6000, manufactured by SII Nanotechnology Inc.) is used for measurement, as follows: in the first step, the temperature is raised to 150° C. at a heating rate of 5° C./min. to remove adsorbed water from a sample; in the second step, the temperature is decreased by air cooling to room temperature at a cooling rate of 5° C./min.; in the third step, a final measurement is made at a heating rate of 5° C./min. to determine a value in the temperature range of from 50° C. to 150° C., wherein the value is regarded as a CTE.

The resin film can be obtained using, for example, a resin composition according to an embodiment of the present invention, that is, a resin composition containing the above-mentioned resin (a), solvent (b), and solvent (c). In this case, the resin film is a resin film containing, as a main component, a repeating unit represented by the chemical formula (4), wherein the resin film contains the total of 95 mass % or more of a tetracarboxylic acid residue having an SP value of 15 or more and 17 or less and a diamine residue having an SP value of 11 or more and 13 or less with respect to the total of 100 mass % of A and B contained in the resin film.

Below, a method of producing a resin film according to an embodiment of the present invention will be described. This method of producing a resin film includes: a film-forming step of forming a coating film of a resin composition; and a heating step of heating the coating film at a temperature of 220° C. or more.

In the film-forming step, a varnish, which is one of the resin compositions according to an embodiment of the present invention, is first applied onto a support. A coating film of a varnish is thus formed on the support. Examples of supports include wafer substrates such as of silicon and gallium arsenide; glass substrates such as of sapphire glass, soda lime glass, and alkali-free glass; metal substrates or metal foils such as of stainless steel and copper; ceramics substrates; and the like. Among others, alkali-free glass is preferable from the viewpoint of surface smoothness and dimensional stability against heating.

Examples of varnish coating methods include spin coating, slit coating, dip coating, spray coating, and printing, which may be used in combination. In cases where a resin film is used as a substrate for displays, it is necessary to apply a varnish onto a support having a large size, and accordingly, the use of a slit coating method is particularly preferable.

The support may be pretreated in advance before being coated. Examples of such pretreatment methods include a method in which a pretreatment agent is dissolved in an amount of 0.5 to 20 mass % in a solvent such as isopropanol, ethanol, methanol, water, tetrahydrofuran, propylene glycol monomethyl ether acetate, propylene glycol monomethyl ether, ethyl lactate, or diethyl adipate to prepare a solution, which is then used to treat the surface of a support by a technique such as spin coating, slit die coating, bar coating, dip coating, spray coating, or steam processing. In addition, vacuum drying may be carried out, if necessary, followed by heat treatment at 50° C. to 300° C. to accelerate the reaction between the support and the pretreatment agent.

The coating step is commonly followed by drying the varnish coating film. Useful drying methods include reduced pressure drying methods, thermal drying methods, and combinations thereof. The reduced pressure drying methods include, for example, a process in which a support with a coating film formed thereon is put in a vacuum chamber, followed by reducing the pressure in the vacuum chamber. Thermal drying may be performed by using a tool such as hot plate, oven, and infrared ray. When using a hot plate, the coating film is put directly on the plate or held on jigs such as proxy pins fixed on the plate, followed by thermal drying. The heating temperature varies depending on the type and purpose of the solvent used for the varnish, and the heating is performed preferably at a temperature in the range of from room temperature to 180° C. for one minute to several hours.

In cases where a resin composition according to an embodiment of the present invention contains a photoacid generating agent, a pattern can be formed by processing the dried coating film by the method described below. In this method, for example, an actinic ray is radiated to the coating film through a mask of a desired pattern to perform light exposure. Different types of actinic ray available for the light exposure include ultraviolet ray, visible light, electron beam, and X-ray, and the i-line (365 nm), h-line (405 nm), and g-line (436 nm) of mercury lamps are preferred for the present invention. If the film is positively photosensitive, the exposed parts are dissolved by a developer. If the film is negatively photosensitive, the exposed parts harden and become insoluble in a developer.

After the exposure step, a developer is used to remove the exposed parts of a positive film or unexposed parts of a negative film to form a desired pattern on the coating film. For either of a positive film and a negative film, a preferable developer is an aqueous solution of a compound that exhibits alkalinity, such as tetramethyl ammonium. To such an aqueous alkali solution, a polar solvent such as N-methyl-2-pyrrolidone, alcohols, esters, ketones, or the like may optionally be added singly or in combination of two or more kinds thereof.

Finally, a heating step is carried out, in which the coating film on the support is heat-treated to form a resin film. In this heating step, the coating film is heat-treated in the range of 180° C. or more and 600° C. or less, preferably 220° C. or more and 600° C. or less, to fire the coating film. The resin film can thus be produced. The heating temperature of 220° C. or more allows the imidization to progress sufficiently and affords a resin film having excellent mechanical characteristics.

The resin film obtained through the above-mentioned film-forming step and heating step can be used after being detached from the support, or can be directly used without being detached from the support.

Examples of detaching methods include: a method in which the resin film is mechanically detached; a method in which the resin film is immersed in water; a method in which the resin film is immersed in a liquid chemical such as hydrochloric acid or hydrofluoric acid; and a method in which a laserbeam in the wavelength range from ultraviolet light to infrared light is radiated to the interface between the film-like object of a polyimide resin composition and the substrate. In particular, in cases where a device is produced on the film-like object (a resin film) of a polyimide resin composition followed by detaching the resulting product, it is necessary to detach the product without damaging the device, and thus, the product is preferably detached using an ultraviolet light laser. To facilitate the detachment, the support may be coated with a release agent or filmed with a sacrifice layer before the support is coated with a resin composition such as a varnish. Examples of release agents include silicone-based, fluorine-based, aromatic polymer-based, and alkoxysilane-based release agents, and the like. Examples of sacrifice layers include metal films, metal oxide films, amorphous silicon films, and the like.

A resin film according to an embodiment of the present invention can be used suitably as a substrate for displays such as a substrate for organic EL displays, substrate for liquid crystal displays, substrate for micro-LED displays, substrate for flexible color filters, substrate for flexible electronic paper, and substrate for flexible touch panels. For these applications, the tensile elongation percentage and tensile maximum stress of the resin film are preferably 20% or more and 200 MPa or more respectively.

For the present invention, there are no specific limitations on the film thickness of the resin film, but its film thickness is preferably 3 μm or more. It is more preferably 5 μm or more, still more preferably 7 μm or more. In addition, the film thickness of the resin film is preferably 30 μm or less. It is more preferably 25 μm or less, still more preferably 20 μm or less. The resin film having a film thickness of 3 μm or more affords mechanical characteristics sufficient for substrates for displays. In addition, the resin film having a film thickness of 30 μm or less affords toughness sufficient for substrates for displays.

(Laminate and Method of Producing the Same)

Next, a laminate according to an embodiment of the present invention will be described. A laminate according to an embodiment of the present invention is a laminate composed of a resin film according to an embodiment of the present invention and an inorganic film. This laminate preferably has the below-mentioned structure. That is, the face of the resin film to be in contact with the inorganic film in this laminate is selected by the method including etching a resin film from one face in the film thickness direction to a thickness of the half of the original thickness to obtain a first resin film; etching another resin film from the other face in the film thickness to a thickness of half of the original thickness to obtain a second resin film; comparing CTEs of the first and second resin films; and selecting the face of the first or second resin film having a smaller CTE as the face to be in contact with the inorganic film. This laminate is composed of a resin film and an inorganic film, and thus, can prevent moisture, oxygen, or the like existing outside the display substrate from passing through the resin film to degrade the pixel driving element, light emitting element, or the like. In addition, it is possible to obtain a display substrate that is less likely to cause cracks to an inorganic film and has excellent flex resistance and reliability. A resin film contained in this laminate is preferably a resin film obtained from a resin composition according to an embodiment of the present invention. Below, a laminate according to an embodiment of the present invention is suitably referred to as a "laminate" for short.

Below, a method of producing a laminate according to an embodiment of the present invention will be described. In this method of producing a laminate, the film-forming step and heating step are first carried out in accordance with the above-mentioned method of producing a resin film to thereby form a resin film according to an embodiment of the present invention on a support. In this case, the above-mentioned face E is the surface side of the resin film. Subsequently, an inorganic film is provided on the resin film to obtain a laminate according to an embodiment of the present invention. Examples of the inorganic film include silicon oxide (SiOx), silicon nitride (SiNy), silicon oxynitride (SiOxNy), and the like. Each of these may be used in monolayer form, or two or more kinds of them may be used in laminate form. Such inorganic film layers may be, for example, stacked alternately with film layers of organic material such as polyvinyl alcohol. Such a method of forming an inorganic film is preferably carried out using a vapor deposition method such as the chemical vapor deposition (CVD) technique or the physical vapor deposition (PVD) technique.

In a method of producing a laminate, a laminate composed of a resin film and an inorganic film may further be formed on the inorganic film, if necessary. Layering a plurality of laminates affords a display substrate having more excellent reliability. In cases where a plurality of laminates are layered, at least one laminate of the plurality of laminates needs only to be a laminate according to an embodiment of the present invention. From the viewpoint of simplification of processes, the resin films contained the plurality of laminate layers are more preferably the same.

(Image Display Device and Method of Producing the Same)

Next, an image display device according to an embodiment of the present invention will be described. An image display device according to an embodiment of the present invention includes a resin film or laminate according to an embodiment of the present invention.

Below, a method of producing an image display device according to an embodiment of the present invention will be described. The method of producing an image display device includes at least the above-mentioned film-forming step and heating step, and further includes an element-forming step of forming an image displaying element on a resin film for display substrates. In this method of producing an image display device, the film-forming step and heating step are first carried out in accordance with the above-mentioned method of producing a resin film or laminate to thereby produce a resin film or laminate according to an embodiment of the present invention on a support.

In the element-forming step, an image displaying element suitable for an image display device of interest is subsequently formed on the resin film or laminate obtained as above-mentioned. For example, in cases where the image display device is an organic EL display, a TFT, which works as an image driving element, a first electrode, a light emitting element, a second electrode, and a sealing film are formed in this order, and thus, an organic EL element is formed as an image displaying element of interest. In cases where the image display device is a liquid crystal display, a TFT, which works as an image driving element, a first electrode, a first substrate having a first oriented film formed thereon, a second electrode, and a second substrate having a second oriented film formed thereon are used to form a liquid crystal cell, into which liquid crystal is injected to form an image displaying element of interest. For color filters, a black matrix is formed, if necessary, and then, coloring pixels such as of red, green, and blue are formed to form an image displaying element of interest. For substrates for touch panels, a wiring layer and an insulating layer are formed on a resin film or a laminate.

Finally, the resin film or laminate is detached from the support, and the detached resin film or laminate (either of which has an image displaying element of interest formed thereon) is used to obtain an image display device or organic EL display including the resin film or laminate. The support and the resin film or laminate are detached from each other at the interface therebetween using, for example, a method in which a laser is used, a method in which both are mechanically detached, or a method in which the support is etched. In the method in which a laser is used, the laser beam is applied to that side of a support such as a glass substrate which has no element formed thereon, and thus, the detachment can be carried out without causing damage to the element. To facilitate the detachment, furthermore, a primer layer may be provided between the support and the resin film or laminate.

EXAMPLES

The present invention will be described below with reference to Examples and the like, but the present invention is not limited by the Examples and the like. First, measurement, evaluation, testing, and the like carried out in the following Examples and Comparative Examples will be described.

(First Item: Measurement of Percent Change in Viscosity of Resin Composition)

As the first item, measurement of percent change in the viscosity of a resin composition will be described. In measurement of percent change in the viscosity of a resin composition, a varnish obtained in each of the Synthesis Examples as below-mentioned was placed in a clean bottle (manufactured by Aicello Corporation) and stored at 23° C. for 60 days. The viscosity of the varnish was measured before and after the storage, and the percent change in viscosity was calculated by the equation given below. In this regard, the viscosity at 25° C. was measured using a viscometer (TVE-22H, manufactured by Toki Sangyo Co., Ltd.).

Percent change in viscosity (%)=(viscosity after storage−viscosity before storage)/viscosity before storage×100

(Second Item: Measurement of Tensile Elongation Percentage and Tensile Maximum Stress of Resin Film)

As the second item, measurement of the tensile elongation percentage and tensile maximum stress of a resin film will be described. The tensile elongation percentage and tensile maximum stress of a resin film were measured using a resin film obtained in each of the below-mentioned Examples and using a TENSILON universal material testing instrument (RTM-100, manufactured by Orientec Corporation) in accordance with the Japanese Industrial Standards (JIS K 7127:1999). The measurement conditions include a test piece width of 10 mm, a chuck-to-chuck distance of 50 mm, a testing speed of 50 mm/min, and the number of measurements, n, of 10.

(Third Item: Measurement of CTE of Resin Film)

As the third item, measurement of CTE of a resin film will be described. The CTE of a resin film was measured using a resin film obtained in each of the below-mentioned Examples and using a thermomechanical analyzer (EXSTAR6000TMA/SS6000, manufactured by SII Nanotechnology Inc.). In the first step, the temperature was raised to 150° C. at a heating rate of 5° C./min. to remove adsorbed water from a sample, and in the second step, the temperature was decreased by air cooling to room temperature at a cooling rate of 5° C./min. In the third step, the measurement was made at a heating rate of 5° C./min. The CTE of a resin film of interest was determined in the temperature range of from 50° C. to 150° C. in the measurement.

(Fourth Item: Measurement of CTE (A) and CTE (B) of Resin Film)

As the fourth item, measurement of the CTE (A) and CTE (B) of a resin film will be described. For measurement of the CTE (A) and CTE (B), the CTE of a resin film having a film thickness reduced to half by plasma etching and the CTE of a resin film the other face of which was treated in the same manner were measured by the above-mentioned method for the third item, wherein the resin film was obtained in each of the below-mentioned Examples and adhered to a glass substrate. Of the obtained CTE measurements, the smaller value was regarded as a CTE (A), and the larger value was regarded as a CTE (B). In all Examples, the CTE of a resin film one side of which was etched was the CTE (A), wherein the etched side was the surface formed when the film was formed.

(Fifth Item: Measurement of In-Plane Uniformity of Resin Film)

As the fifth item, measurement of the in-plane uniformity of a resin film will be described. For measurement of the in-plane uniformity of a resin film, the resin film formed on a glass substrate (having a length of 350 mm and a width of 300 mm) to have a film thickness of 10 μm after firing was obtained in each of the below-mentioned Examples. In the area excluding the 10 mm wide periphery along the edge of the resin film, the thickness of the film was measured at a total of 180 positions located at equal intervals of 30 mm in the length direction and at equal intervals of 20 mm in the width direction using a film thickness measuring apparatus (RE-8000, manufactured by SCREEN Finetech Solutions Co., Ltd.). From the film thickness measurements, the arithmetic mean film thickness was calculated and adopted as the average film thickness. Then, the in-plane uniformity of the resin film was determined by the equation given below.

In-plane uniformity (%)=(maximum film thickness−minimum film thickness)/(average film thickness)×100

(Sixth Item: Bending Test on Laminate Composed of Resin Film and Inorganic Film)

As the sixth item, a bending test on a laminate composed of a resin film and an inorganic film will be described. In this bending test of a laminate, the laminate, which was composed of a resin film and an inorganic film and obtained in each of the below-mentioned Examples, was used to carry out the test in accordance with the following approach. First, a sample, 100 mm×140 mm, was taken out of the laminate detached from the glass substrate, and a metal column having a diameter of 10 mm was fixed along the central position on the resin film side of the sample so as to be in parallel with the shorter side of the sample. The sample was placed along the column so as to make a holding angle of 0° with the column (the sample being a flat plane), and the sample underwent a bending action ten times in the range up to a holding angle of 180° with the column (the sample being bent back around the column) in such a manner that the inorganic film faced outward. After the bending action, an optical microscope (OPTIPHOT300, manufactured by Nikon Corporation) was used to visually observe whether any crack was generated in the inorganic film of the sample. A sample that generated any crack when bent once was rated as level D, two to three times level C, four to six times level B, seven to nine times level A, and a sample that generated no crack when bent 10 times was rated as level S. The rating levels S to D indicate how favorable the bending test results were. Of the rating levels S to D, S means "the best", and A, B, C, and D mean that the bending test results are worse increasingly in this order. The meanings of these rating levels S to D are the same for the other evaluation results and test results.

(Seventh Item: Measurement of Imidization Rate of Resin (a) and Calculation of Value "(2r+q)/(2p+2q+2r)")

As the seventh item, measurement of the imidization rate of the resin (a) and calculation of the value "(2r+q)/(2p+2q+2r)" will be described. For the measurement and calculation, the resin (a) obtained in each of the below-mentioned Synthesis Examples was measured for $^1$H-NMR spectrum using a magnetic nuclear resonance apparatus (EX-270, manufactured by JEOL Ltd.). The varnish obtained in each of the Synthesis Examples was diluted with a deuterated solvent (deuterated dimethyl sulfoxide) to provide a measurement sample. The integral value (denoted as α) of all $^1$H peaks contained in the diamine residue and tetracarboxylic acid residue contained in the resin composition component was determined. Then, the integral value (denoted as ε) of the $^1$H peak of the amide group in the resin (a) was determined. These values were used to measure the imidization rate of the resin (a) contained in the resin composition.

Imidization rate=(β−ε)/β×100

Here, β=α/ω×2; and ω is the number of the hydrogen atoms included in the calculation of α.

Next, the value of "(2r+q)/(2p+2q+2r)" was calculated in accordance with the following equation as above-mentioned, wherein p, q, and r are the number of moles of a repeating unit represented by the chemical formula (1), the number of moles of a repeating unit represented by the chemical formula (3), and the number of moles of a repeating unit represented by the chemical formula (4) respectively, wherein the repeating units are contained in the resin (a).

$(2r+q)/(2p+2q+2r)$=imidization rate/100

(Eighth Item: Evaluation of Reliability of Organic EL Display)

As the eighth item, evaluation of the reliability of an organic EL display will be described. For evaluation of the reliability of an organic EL display, a voltage was applied to the organic EL display through a driving circuit so that the organic EL display could emit light, wherein the organic EL display included a display substrate containing a resin film obtained in each of the below-mentioned Examples. Subsequently, the organic EL display was bent once with the light-emitting side facing outward, in the same manner as in the sixth item, and was set to emit light again, followed by observing the formation of non-luminous portions called dark spots. In this case, an organic EL display on which any dark spot was formed was rated as level D. In cases where no dark spot was formed on an organic EL display, the organic EL display, which was bent, was left to stand for several days in an environment at 85° C. and 85% RH and was set to emit light again, followed by observing the formation of dark spots. An organic EL display which was left to stand in an environment at 85° C. and 85% RH for seven days or more and on which no dark spot was formed was rated as level S, an organic EL display on which any dark spot was formed in four to six days was rated as level A, two to three days level B, and one day level C.

(Compound)

In Examples and Comparative Examples, the below-mentioned compounds were suitably used. The compounds and abbreviations suitably used in Examples and Comparative Examples are as below-mentioned. In this regard, the SP value of a tetracarboxylic acid having the same tetracarboxylic acid residue is described as the SP value of a tetracarboxylic dianhydride.

BPDA: 3,3',4,4'-biphenyltetracarboxylic dianhydride (having an SP value of 15.2)
PMDA: pyromellitic dianhydride (having an SP value of 16.3)
HPMDA: 1,2,4,5-cyclohexane tetracarboxylic dianhydride (having an SP value of 14.3)
NTCDA: 2,3,6,7-naphthalene tetracarboxylic dianhydride (having an SP value of 15.9)
ODPA: bis(3,4-dicarboxyphenyl) ether dianhydride (having an SP value of 15.2)
BTDA: 3,3',4,4'-benzophenone tetracarboxylic dianhydride (having an SP value of 15.5)
PYDA: 2,3,5,6-pyridine tetracarboxylic dianhydride (having an SP value of 17.3)
6FDA: 2,2-bis(3,4-dicarboxyphenyl)hexafluoro propane dianhydride (having an SP value of 13.4)
BSAA: 2,2-bis[4-(3,4-dicarboxyphenoxy)phenyl] propane dianhydride (having an SP value of 13.4)
PDA: p-phenylene diamine (having an SP value of 12.3)
TFMB: 2,2'-di(trifluoromethyl)-4,4'-diaminobiphenyl (having an SP value of 11.3)
DAE: 4,4'-diaminodiphenyl ether (having an SP value of 12.3)
mTB: 2,2'-dimethyl-4,4'-diaminobiphenyl (having an SP value of 11.7)
DABA: 4,4'-diaminobenzanilide (having an SP value of 13.8)
CHDA: trans-1,4-cyclohexane diamine (having an SP value of 10.4)
HFHA: 2,2-bis[4-(4-aminophenoxy)phenyl] hexafluoropropane (having an SP value of 14.3)
SiDA: di(aminopropyldimethyl) siloxane (having an SP value of 8.6)
DIBOC: di-tert-butyl dicarbonate
DMSO: dimethyl sulfoxide (having an SP value of 13.2 and a boiling point of 189° C.)
DMPU: N,N'-dimethylpropylene urea (having an SP value of 9.7 and a boiling point of 220° C.)
DMIB: N,N-dimethyl isobutylamide (having an SP value of 9.9 and a boiling point of 175° C.)
DMI: 1,3-dimethyl-2-imidazolidinone (having an SP value of 9.9 and a boiling point of 204° C.)
GBL: γ-butyrolactone (having an SP value of 9.9 and a boiling point of 204° C.)
EL: ethyl lactate (having an SP value of 11.0 and a boiling point of 154° C.)
MPA: 3-methoxy-N,N-dimethyl propionamide (having an SP value of 10.3 and a boiling point of 216° C.)
CHN: cyclohexanone (having an SP value of 9.8 and a boiling point of 156° C.)
NMP: N-methyl-2-pyrrolidone (having an SP value of 11.5 and a boiling point of 204° C.)
PMA: propylene glycol monomethyl ether acetate (having an SP value of 8.7 and a boiling point of 146° C.)
DPMA: dipropylene glycol methyl ether acetate (having an SP value of 8.7 and a boiling point of 213° C.)
Anisole: (having an SP value of 9.4 and a boiling point of 154° C.)
MMBAc: 3-methoxy-3-methyl-1-butyl acetate (having an SP value of 8.5 and a boiling point of 188° C.)
DPDM: dipropylene glycol dimethyl ether (having an SP value of 7.9 and a boiling point of 171° C.)
EEA: ethylene glycol monoethyl ether acetate (having an SP value of 8.9 and a boiling point of 145° C.)
Toluene: (having an SP value of 9.1 and a boiling point of 111° C.)
MBA: 3-methoxybutyl acetate (having an SP value of 8.7 and a boiling point of 171° C.)
TMSO: tetramethylene sulfoxide (having an SP value of 14.8 of a boiling point of 236° C.)
Heptane: (having an SP value of 7.4 and a boiling point of 98° C.)

Synthesis Example 1

The varnish in Synthesis Example 1 will be described. In Synthesis Example 1, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.01 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, BPDA (21.35 g (72.6 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 2

The varnish in Synthesis Example 2 will be described. In Synthesis Example 2, a thermometer and a stirring rod equipped with stirring blades were fitted on a 300-mL four-necked flask. Then, DMSO (119 g) and PMA (51 g) were added into the flask under a dry nitrogen gas stream and heated to 60° C. After the resulting mixture was heated, PDA (8.18 g (75.7 mmol)) and BPDA (21.82 g (74.2 mmol)) were added to the mixture with stirring. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 3

The varnish in Synthesis Example 3 will be described. In Synthesis Example 3, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (9.81 g (90.7 mmol)) was added to the mixture with stirring, and the dissolution of the PDA was verified, followed by adding DIBOC (0.79 g (3.6 mmol)) to the resulting mixture. After the resulting mixture was stirred for one hour, PMDA (19.40 g (88.9 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 4

The varnish in Synthesis Example 4 will be described. In Synthesis Example 4, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.80 g (81.4 mmol)) was added to the mixture with stirring, and the dissolution of the PDA was verified, followed by adding DIBOC (0.71 g (3.3 mmol)) to the resulting mixture. After the resulting mixture was stirred for one hour, BPDA (11.97 g (40.7 mmol)) and PMDA (8.52 g (39.1 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 5

The varnish in Synthesis Example 5 will be described. In Synthesis Example 5, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (5.80 g (53.6 mmol)) and TFMB (4.28 g (13.4 mmol)) were added to the mixture with stirring, and the dissolution of the PDA and TFMB was verified, followed by adding DIBOC (0.59 g (2.7 mmol)) to the resulting mixture. After the resulting mixture was stirred for one hour, BPDA (19.33 g (65.7 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 6

The varnish in Synthesis Example 6 will be described. In Synthesis Example 6, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.01 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, BPDA (21.35 g (72.6 mmol)) was added to the mixture, and the resulting mixture was heated to 60° C. After the mixture was stirred for four hours, molecular sieve 4A (10 g) was added to the mixture, followed by heating the resulting mixture to 110° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 7

The varnish in Synthesis Example 7 will be described. In Synthesis Example 7, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.01 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, BPDA (21.35 g (72.6 mmol)) was added to the mixture, and the resulting mixture was heated to 60° C. After the mixture was stirred for four hours, molecular sieve 4A (10 g) was added to the mixture, followed by heating the resulting mixture to 110° C. and stirring the mixture for four hours.

The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 8

The varnish in Synthesis Example 8 will be described. In Synthesis Example 8, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.01 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, BPDA (21.35 g (72.6 mmol)) was added to the mixture, and the resulting mixture was heated to 60° C. After the mixture was stirred for ten hours, the reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 9

The varnish in Synthesis Example 9 will be described. In Synthesis Example 9, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.01 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, BPDA (21.35 g (72.6 mmol)) was added to the mixture, and the resulting mixture was heated to 60° C. After the mixture was stirred for four hours, molecular sieve 4A (10 g) was added to the mixture, followed by heating the resulting mixture to 70° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 10

The varnish in Synthesis Example 10 will be described. In Synthesis Example 10, a thermometer and a stirring rod equipped with stirring blades were fitted on a 300-mL four-necked flask. Then, DMSO (153 g) and DPMA (17 g) were added into the flask under a dry nitrogen gas stream and heated to 40° C. After the resulting mixture was heated, PDA (8.01 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, BPDA (21.35 g (72.6 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 11

The varnish in Synthesis Example 11 will be described. In Synthesis Example 11, a varnish was obtained in the same manner as in Synthesis Example 1 except that PMA was changed to anisole.

Synthesis Example 12

The varnish in Synthesis Example 12 will be described. In Synthesis Example 12, a varnish was obtained in the same manner as in Synthesis Example 1 except that DMSO was changed to DMPU.

Synthesis Example 13

The varnish in Synthesis Example 13 will be described. In Synthesis Example 13, a varnish was obtained in the same manner as in Synthesis Example 1 except that the weight of DMSO was changed to 165 g and that the weight of PMA was changed to 5 g.

Synthesis Example 14

The varnish in Synthesis Example 14 will be described. In Synthesis Example 14, a varnish was obtained in the same manner as in Synthesis Example 1 except that the weight of DMSO was changed to 153 g and that the weight of PMA was changed to 17 g.

Synthesis Example 15

The varnish in Synthesis Example 15 will be described. In Synthesis Example 15, a varnish was obtained in the same manner as in Synthesis Example 1 except that the weight of DMSO was changed to 60 g and that the weight of PMA was changed to 110 g.

Synthesis Example 16

The varnish in Synthesis Example 16 will be described. In Synthesis Example 16, a varnish was obtained in the same manner as in Synthesis Example 1 except that the weight of DMSO was changed to 85 g and that the weight of PMA was changed to 85 g.

Synthesis Example 17

The varnish in Synthesis Example 17 will be described. In Synthesis Example 17, a varnish was obtained in the same manner as in Synthesis Example 1 except that PMA was changed to MMBAc.

Synthesis Example 18

The varnish in Synthesis Example 18 will be described. In Synthesis Example 18, a varnish was obtained in the same manner as in Synthesis Example 1 except that PMA was changed to DPDM.

Synthesis Example 19

The varnish in Synthesis Example 19 will be described. In Synthesis Example 19, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.15 g (75.3 mmol)) was added to the mixture with stirring, and the dissolution of the PDA was verified, followed by adding DIBOC (0.66 g (3.0 mmol)) to the resulting mixture. After the resulting mixture was stirred for one hour, BPDA (19.51 g (66.3 mmol)) and HPMDA (1.69 g (7.5 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 µm to obtain a varnish.

Synthesis Example 20

The varnish in Synthesis Example 20 will be described. In Synthesis Example 20, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.11 g (75.0 mmol)) was added to the mixture with stirring, and the dissolution of the PDA was verified, followed by adding DIBOC (0.66 g (3.0 mmol)) to the resulting mixture. After the resulting mixture was stirred for one hour, NTCDA (10.06 g (37.5 mmol)) and ODPA (11.17 g (36.0 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 µm to obtain a varnish.

Synthesis Example 21

The varnish in Synthesis Example 21 will be described. In Synthesis Example 21, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.00 g (74.0 mmol)) was added to the mixture with stirring, and the dissolution of the PDA was verified, followed by adding DIBOC (0.65 g (3.0 mmol)) to the resulting mixture. After the resulting mixture was stirred for one hour, NTCDA (9.92 g (37.0 mmol)) and BTDA (11.44 g (35.5 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 µm to obtain a varnish.

Synthesis Example 22

The varnish in Synthesis Example 22 will be described. In Synthesis Example 22, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, DAE (12.08 g (60.3 mmol)) was added to the mixture with stirring, and the dissolution of the DAE was verified, followed by adding DIBOC (0.53 g (2.4 mmol)) to the resulting mixture. After the resulting mixture was stirred for one hour, BPDA (17.39 g (59.1 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 µm to obtain a varnish.

Synthesis Example 23

The varnish in Synthesis Example 23 will be described. In Synthesis Example 23, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, mTB (12.50 g (58.9 mmol)) was added to the mixture with stirring, and the dissolution of the mTB was verified, followed by adding DIBOC (0.51 g (2.4 mmol)) to the resulting mixture. After the resulting mixture was stirred for one hour, BPDA (16.98 g (57.7 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 µm to obtain a varnish.

Synthesis Example 24

The varnish in Synthesis Example 24 will be described. In Synthesis Example 24, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, DAE (12.73 g (63.6 mmol)) was added to the mixture with stirring, and the dissolution of the DAE was verified, followed by adding DIBOC (0.56 g (2.5 mmol)) to the resulting mixture. After the resulting mixture was stirred for one hour, NTCDA (16.71 g (62.3 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room

Synthesis Example 25

The varnish in Synthesis Example 25 will be described. In Synthesis Example 25, a varnish was obtained in the same manner as in Synthesis Example 1 except that DMSO was changed to DMIB.

Synthesis Example 26

The varnish in Synthesis Example 26 will be described. In Synthesis Example 26, a varnish was obtained in the same manner as in Synthesis Example 1 except that DMSO was changed to DMI.

Synthesis Example 27

The varnish in Synthesis Example 27 will be described. In Synthesis Example 27, a varnish was obtained in the same manner as in Synthesis Example 1 except that DMI (60 g), GBL (20 g), and PMA (20 g) were added in place of DMSO (119 g) and PMA (51 g).

Synthesis Example 28

The varnish in Synthesis Example 28 will be described. In Synthesis Example 28, a varnish was obtained in the same manner as in Synthesis Example 27 except that GBL was changed to EL.

Synthesis Example 29

The varnish in Synthesis Example 29 will be described. In Synthesis Example 29, a varnish was obtained in the same manner as in Synthesis Example 27 except that GBL was changed to MPA.

Synthesis Example 30

The varnish in Synthesis Example 30 will be described. In Synthesis Example 30, a varnish was obtained in the same manner as in Synthesis Example 27 except that GBL was changed to CHN.

Synthesis Example 31

The varnish in Synthesis Example 31 will be described. In Synthesis Example 31, a varnish was obtained in the same manner as in Synthesis Example 1 except that PMA was changed to EEA.

Synthesis Example 32

The varnish in Synthesis Example 32 will be described. In Synthesis Example 32, a varnish was obtained in the same manner as in Synthesis Example 1 except that PMA was changed to toluene.

Synthesis Example 33

The varnish in Synthesis Example 33 will be described. In Synthesis Example 33, a varnish was obtained in the same manner as in Synthesis Example 1 except that PMA was changed to MBA.

Synthesis Example 34

The varnish in Synthesis Example 34 will be described. In Synthesis Example 34, a varnish was obtained in the same manner as in Synthesis Example 1 except that the weight of DMSO was changed to 170 g and that the weight of PMA was changed to 0 g.

Synthesis Example 35

The varnish in Synthesis Example 35 will be described. In Synthesis Example 35, a varnish was obtained in the same manner as in Synthesis Example 1 except that PMA was changed to NMP.

Synthesis Example 36

The varnish in Synthesis Example 36 will be described. In Synthesis Example 36, a varnish was obtained in the same manner as in Synthesis Example 34 except that DMSO was changed to PMA.

Synthesis Example 37

The varnish in Synthesis Example 37 will be described. In Synthesis Example 37, a varnish was obtained in the same manner as in Synthesis Example 1 except that DMSO was changed to MMBAc.

Synthesis Example 38

The varnish in Synthesis Example 38 will be described. In Synthesis Example 38, a varnish was obtained in the same manner as in Synthesis Example 1 except that DMSO was changed to TMSO.

Synthesis Example 39

The varnish in Synthesis Example 39 will be described. In Synthesis Example 39, a varnish was obtained in the same manner as in Synthesis Example 1 except that PMA was changed to heptane.

Synthesis Example 40

The varnish in Synthesis Example 40 will be described. In Synthesis Example 40, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.31 g (76.9 mmol)) was added to the mixture with stirring, and the dissolution of the PDA was verified, followed by adding DIBOC (0.67 g (3.1 mmol)) to the resulting mixture. After the resulting mixture was stirred for one hour, BPDA (17.64 g (60.0 mmol)) and PYDA (3.37 g (15.4 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 41

The varnish in Synthesis Example 41 will be described. In Synthesis Example 41, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (8.29 g (76.7 mmol)) was added to the mixture with stirring, and the dissolution of the PDA was verified, followed by adding DIBOC (0.67 g (3.1 mmol)) to the resulting mixture. After the resulting mixture was stirred for one hour, BPDA (17.60 g (59.8 mmol)) and HPMDA (3.44 g (15.3 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 42

The varnish in Synthesis Example 42 will be described. In Synthesis Example 42, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (7.00 g (64.7 mmol)) and DABA (1.63 g (7.2 mmol)) were added to the mixture with stirring, and the dissolution of the PDA and DABA was verified, followed by adding DIBOC (0.63 g (2.9 mmol)) to the resulting mixture. After the resulting mixture was stirred for one hour, BPDA (20.74 g (70.5 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 43

The varnish in Synthesis Example 43 will be described. In Synthesis Example 43, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (6.39 g (59.1 mmol)) and CHDA (1.69 g (14.8 mmol)) were added to the mixture with stirring, and the dissolution of the PDA and CHDA was verified, followed by adding DIBOC (0.64 g (3.0 mmol)) to the resulting mixture. After the resulting mixture was stirred for one hour, BPDA (21.28 g (72.3 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 44

The varnish in Synthesis Example 44 will be described. In Synthesis Example 44, a thermometer and a stirring rod equipped with stirring blades were fitted on a 300-mL four-necked flask. Then, DMSO (170 g) was added into the flask under a dry nitrogen gas stream, and heated to 40° C. After the resulting mixture was heated, DAE (12.73 g (63.6 mmol)) was added to the mixture with stirring, and the dissolution of the DAE was verified, followed by adding DIBOC (0.56 g (2.5 mmol)) to the resulting mixture. After the resulting mixture was stirred for one hour, NTCDA (16.71 g (62.3 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 45

The varnish in Synthesis Example 45 will be described. In Synthesis Example 45, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (7.82 g (72.3 mmol)) was added to the mixture with stirring, and the dissolution of the PDA was verified, followed by adding DIBOC (0.63 g (2.9 mmol)) to the resulting mixture. After the resulting mixture was stirred for one hour, NTCDA (15.13 g (56.4 mmol)) and 6FDA (6.42 g (14.5 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 46

The varnish in Synthesis Example 46 will be described. In Synthesis Example 46, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, PDA (7.54 g (69.7 mmol)) was added to the mixture with stirring, and the dissolution of the PDA was verified, followed by adding DIBOC (0.61 g (2.8 mmol)) to the resulting mixture. After the resulting mixture was stirred for one hour, NTCDA (14.59 g (54.4 mmol)) and BSAA (7.26 g (13.9 mmol)) were added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 47

The varnish in Synthesis Example 47 will be described. In Synthesis Example 47, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, DAE (8.31 g (41.5 mmol)) and HFHA (6.27 g (10.4 mmol)) were added to the mixture with stirring, and the dissolution of the DAE and HFHA was verified, followed by adding DIBOC (0.45 g (2.1 mmol)) to the resulting mixture. After the resulting mixture was stirred for one hour, BPDA (14.96 g (50.9 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

Synthesis Example 48

The varnish in Synthesis Example 48 will be described. In Synthesis Example 48, a thermometer and a stirring rod equipped with stirring blades were fitted on a 300-mL four-necked flask. Then, DMSO (119 g) and PMA (51 g) were added into the flask under a dry nitrogen gas stream and heated to 40° C. After the resulting mixture was heated, DAE (10.10 g (50.4 mmol)) and SiDA (2.28 g (8.9 mmol)) were added to the mixture with stirring, and the dissolution of the DAE and SiDA was verified, followed by adding DIBOC (0.52 g (2.4 mmol)) to the resulting mixture. After the resulting mixture was stirred for one hour, BPDA (17.10 g (58.1 mmol)) was added to the mixture, and the resulting mixture was heated to 60° C. After the mixture was stirred for four hours, molecular sieve 4A (10 g) was added to the mixture, followed by heating the resulting mixture to 90° C. and stirring the mixture for six hours. The resulting reaction solution was cooled to room temperature, then diluted with a solvent having the same composition as the solvent used for polymerization, so as to have a viscosity of approximately 2000 cP, and filtered through a filter having a filter pore size of 0.2 μm to obtain a varnish.

The compositions of the varnishes obtained in Synthesis Examples 1 to 48 are listed in Tables 1 to 3.

TABLE 1

| Synthesis Example | Solvent (Weight ratio) | SP value | Boiling point (° C.) | Difference in boiling point between solvent (c) and solvent (b) (° C.) | Tetracarboxylic dianhydride (Molar ratio) | SP value of tetracarboxylic acid | Diamine (Molar ratio) | SP value | Molar ratio of end capping agent | Amount of tetracarboxylic acid residue having SP value of 15-17 and diamine residue having SP value of 11-13 (mass %) | Imide group concentration (%) | (2r + q)/(2p + 2q + 2r) |
|---|---|---|---|---|---|---|---|---|---|---|---|---|
| Synthesis Example 1 | DMSO (70) PMA (30) | 13.2 8.7 | 189 146 | 43 | BPDA (98) | 15.2 | PDA (100) | 12.3 | 4 | 100 | 39 | 0.14 |
| Synthesis Example 2 | DMSO (70) PMA (30) | 13.2 8.7 | 189 146 | 43 | BPDA (98) | 15.2 | PDA (100) | 12.3 | 0 | 100 | 39 | 0.14 |
| Synthesis Example 3 | DMSO (70) PMA (30) | 13.2 8.7 | 189 146 | 43 | PMDA (98) | 16.3 | PDA (100) | 12.3 | 4 | 100 | 49 | 0.14 |
| Synthesis Example 4 | DMSO (70) PMA (30) | 13.2 8.7 | 189 146 | 43 | BPDA (50) PMDA (48) | 15.2 16.3 | PDA (100) | 12.3 | 4 | 100 | 43 | 0.14 |
| Synthesis Example 5 | DMSO (70) PMA (30) | 13.2 8.7 | 189 146 | 43 | BPDA (98) | 15.2 | PDA (80) TFMB(20) | 12.3 11.3 | 4 | 100 | 34 | 0.14 |
| Synthesis Example 6 | DMSO (70) PMA (30) | 13.2 8.7 | 189 146 | 43 | BPDA (98) | 15.2 | PDA (100) | 12.3 | 4 | 100 | 39 | 0.35 |
| Synthesis Example 7 | DMSO (70) PMA (30) | 13.2 8.7 | 189 146 | 43 | BPDA (98) | 15.2 | PDA (100) | 12.3 | 4 | 100 | 39 | 0.26 |
| Synthesis Example 8 | DMSO (70) PMA (30) | 13.2 8.7 | 189 146 | 43 | BPDA (98) | 15.2 | PDA (100) | 12.3 | 4 | 100 | 39 | 0.02 |
| Synthesis Example 9 | DMSO (70) PMA (30) | 13.2 8.7 | 189 146 | 43 | BPDA (98) | 15.2 | PDA (100) | 12.3 | 4 | 100 | 39 | 0.08 |
| Synthesis Example 10 | DMSO (90) DPMA (10) | 13.2 8.7 | 189 213 | −24 | BPDA (98) | 15.2 | PDA (100) | 12.3 | 4 | 100 | 39 | 0.14 |
| Synthesis Example 11 | DMSO (70) Anisole (30) | 13.2 9.4 | 189 154 | 35 | BPDA (98) | 15.2 | PDA (100) | 12.3 | 4 | 100 | 39 | 0.14 |
| Synthesis Example 12 | DMPU (70) PMA (30) | 9.7 8.7 | 220 146 | 74 | BPDA (98) | 15.2 | PDA (100) | 12.3 | 4 | 100 | 39 | 0.14 |
| Synthesis Example 13 | DMSO (97) PMA (3) | 13.2 8.7 | 189 146 | 43 | BPDA (98) | 15.2 | PDA (100) | 12.3 | 4 | 100 | 39 | 0.14 |
| Synthesis Example 14 | DMSO (90) PMA (10) | 13.2 8.7 | 189 146 | 43 | BPDA (98) | 15.2 | PDA (100) | 12.3 | 4 | 100 | 39 | 0.14 |
| Synthesis Example 15 | DMSO (35) PMA (65) | 13.2 8.7 | 189 146 | 43 | BPDA (98) | 15.2 | PDA (100) | 12.3 | 4 | 100 | 39 | 0.14 |
| Synthesis Example 16 | DMSO (50) PMA (50) | 13.2 8.7 | 189 146 | 43 | BPDA (98) | 15.2 | PDA (100) | 12.3 | 4 | 100 | 39 | 0.14 |

TABLE 2

| Synthesis Example | Solvent (Weight ratio) | Solvent SP value | Boiling point (° C.) | Difference in boiling point between solvent (c) and solvent (b) (° C.) | Tetracarboxylic dianhydride (Molar ratio) | SP value of tetracarboxylic acid | Diamine (Molar ratio) | Diamine SP value | Molar ratio of end capping agent | Amount of tetracarboxylic acid residue having SP value of 15-17 and diamine residue having SP value 11-13 (mass %) | Imide group concentration (%) | (2r + q)/(2p + 2q + 2r) |
|---|---|---|---|---|---|---|---|---|---|---|---|---|
| Synthesis Example 17 | DMSO (70) MMBAc (30) | 13.2 8.5 | 189 188 | 1 | BPDA (98) | 15.2 | PDA (100) | 12.3 | 4 | 100 | 39 | 0.14 |
| Synthesis Example 18 | DMSO (70) DPDM (30) | 13.2 7.9 | 189 171 | 18 | BPDA (98) | 15.2 | PDA (100) | 12.3 | 4 | 100 | 39 | 0.14 |
| Synthesis Example 19 | DMSO (70) PMA (30) | 13.2 8.7 | 189 146 | 43 | BPDA (88) HPMDA (10) | 15.2 14.3 | PDA (100) | 12.3 | 4 | 96 | 39 | 0.14 |
| Synthesis Example 20 | DMSO (70) PMA (30) | 13.2 8.7 | 189 146 | 43 | NTCDA (50) ODPA (48) | 15.9 15.2 | PDA (100) | 12.3 | 4 | 100 | 39 | 0.14 |
| Synthesis Example 21 | DMSO (70) PMA (30) | 13.2 8.7 | 189 146 | 43 | NTCDA (50) BTDA (48) | 15.9 15.5 | DAE (100) | 12.3 | 4 | 100 | 39 | 0.14 |
| Synthesis Example 22 | DMSO (70) PMA (30) | 13.2 8.7 | 189 146 | 43 | BPDA (98) | 15.2 | mTB (100) | 11.7 | 4 | 100 | 31 | 0.14 |
| Synthesis Example 23 | DMSO (70) PMA (30) | 13.2 8.7 | 189 146 | 43 | BPDA (98) | 15.2 | DAE (100) | 12.3 | 4 | 100 | 30 | 0.14 |
| Synthesis Example 24 | DMSO (70) PMA (30) | 13.2 8.7 | 189 146 | 43 | NTCDA (98) | 15.9 | PDA (100) | 12.3 | 4 | 100 | 33 | 0.14 |
| Synthesis Example 25 | DMIB (70) PMA (30) | 9.9 8.7 | 175 146 | 29 | BPDA (98) | 15.2 | PDA (100) | 12.3 | 4 | 100 | 39 | 0.14 |
| Synthesis Example 26 | DMI (70) PMA (30) | 9.9 8.7 | 204 146 | 58 | BPDA (98) | 15.2 | PDA (100) | 12.3 | 4 | 100 | 39 | 0.14 |
| Synthesis Example 27 | DMI (60) GBL (20) PMA (20) | 9.9 9.9 8.7 | 204 204 146 | 58 | BPDA (98) | 15.2 | PDA (100) | 12.3 | 4 | 100 | 39 | 0.14 |
| Synthesis Example 28 | DMI (60) EL (20) PMA (20) | 9.9 11.0 8.7 | 204 154 146 | 8 | BPDA (98) | 15.2 | PDA (100) | 12.3 | 4 | 100 | 39 | 0.14 |
| Synthesis Example 29 | DMI (60) MPA (20) PMA (20) | 9.9 10.3 8.7 | 204 216 146 | 58 | BPDA (98) | 15.2 | PDA (100) | 12.3 | 4 | 100 | 39 | 0.14 |
| Synthesis Example 30 | DMI (60) CHN (20) PMA (20) | 9.9 9.8 8.7 | 204 156 146 | 10 | BPDA (98) | 15.2 | PDA (100) | 12.3 | 4 | 100 | 39 | 0.14 |
| Synthesis Example 31 | DMSO (70) EEA (30) | 13.2 8.9 | 189 145 | 44 | BPDA (98) | 15.2 | PDA (100) | 12.3 | 4 | 100 | 39 | 0.14 |
| Synthesis Example 32 | DMSO (70) toluene (30) | 13.2 9.1 | 189 111 | 78 | BPDA (98) | 15.2 | PDA (100) | 12.3 | 4 | 100 | 39 | 0.14 |

TABLE 3

| Synthesis Example | Solvent (Weight ratio) | SP value | Boiling point (° C.) | Difference in boiling point between solvent (c) and solvent (b) (° C.) | Tetracarboxylic dianhydride (Molar ratio) | SP value of tetracarboxylic acid | Diamine (Molar ratio) | SP value | Molar ratio of end capping agent | Amount of tetracarboxylic acid residue having SP value of 15-17 and diamine residue having SP value of 11-13 (mass %) | Imide group concentration (%) | (2r + q)/(2p + 2q + 2r) |
|---|---|---|---|---|---|---|---|---|---|---|---|---|
| Synthesis Example 33 | DMSO (70) MBA (30) | 13.2 / 8.7 | 189 / 171 | 18 | BPDA (98) | 15.2 | PDA (100) | 12.3 | 4 | 100 | 39 | 0.14 |
| Synthesis Example 34 | DMSO (100) | 13.2 | 189 | — | BPDA (98) | 15.2 | PDA (100) | 12.3 | 4 | 100 | 39 | 0.14 |
| Synthesis Example 35 | DMSO (70) NMP (30) | 13.2 / 11.5 | 189 / 204 | — | BPDA (98) | 15.2 | PDA (100) | 12.3 | 4 | 100 | 39 | 0.14 |
| Synthesis Example 36 | PMA (100) | 8.7 | 146 | — | BPDA (98) | 15.2 | PDA (100) | 12.3 | 4 | 100 | 39 | 0.14 |
| Synthesis Example 37 | MMBAc (70) PMA (30) | 8.5 / 8.7 | 188 / 146 | — | BPDA (98) | 15.2 | PDA (100) | 12.3 | 4 | 100 | 39 | 0.14 |
| Synthesis Example 38 | TMSO (70) PMA (30) | 14.8 / 8.7 | 236 / 146 | 90 | BPDA (98) | 15.2 | PDA (100) | 12.3 | 4 | 100 | 39 | 0.14 |
| Synthesis Example 39 | DMSO (70) heptane (30) | 13.2 / 7.4 | 189 / 98 | 91 | BPDA (98) | 15.2 | PDA (100) | 12.3 | 4 | 100 | 39 | 0.14 |
| Synthesis Example 40 | DMSO (70) PMA (30) | 13.2 / 8.7 | 189 / 146 | 43 | BPDA (78) PYDA (20) | 15.2 / 17.3 | PDA (100) | 12.3 | 4 | 93 | 40 | 0.14 |
| Synthesis Example 41 | DMSO (70) PMA (30) | 13.2 / 8.7 | 189 / 146 | 43 | BPDA (78) HPMDA (20) | 15.2 / 14.3 | PDA (100) | 12.3 | 4 | 92 | 40 | 0.14 |
| Synthesis Example 42 | DMSO (70) PMA (30) | 13.2 / 8.7 | 189 / 146 | 43 | BPDA (98) | 15.2 | PDA (90) DABA (10) | 12.3 / 13.8 | 4 | 92 | 37 | 0.14 |
| Synthesis Example 43 | DMSO (70) PMA (30) | 13.2 / 8.7 | 189 / 146 | 43 | BPDA (98) | 15.2 | PDA (80) CHDA (20) | 12.3 / 10.4 | 4 | 93 | 38 | 0.14 |
| Synthesis Example 44 | DMSO (100) | 13.2 | 189 | — | NTCDA (98) | 15.9 | DAE (100) | 12.3 | 4 | 100 | 33 | 0.14 |
| Synthesis Example 45 | DMSO (70) PMA (30) | 13.2 / 8.7 | 189 / 146 | 43 | NTCDA (78) 6FDA (20) | 15.9 / 13.4 | PDA (100) | 12.3 | 4 | 74 | 38 | 0.14 |
| Synthesis Example 46 | DMSO (70) PMA (30) | 13.2 / 8.7 | 189 / 146 | 43 | NTCDA (78) BSAA (20) | 15.9 / 13.4 | PDA (100) | 12.3 | 4 | 70 | 36 | 0.14 |
| Synthesis Example 47 | DMSO (70) PMA (30) | 13.2 / 8.7 | 189 / 146 | 43 | BPDA (98) | 15.2 | DAE (80) HFHA (20) | 12.3 / 14.3 | 4 | 71 | 26 | 0.14 |
| Synthesis Example 48 | DMSO (70) PMA (30) | 13.2 / 8.7 | 189 / 146 | 43 | BPDA (98) | 15.2 | DAE (85) SiDA (15) | 12.3 / 8.6 | 4 | 90 | 30 | 0.14 |

Example 1

In Example 1, the varnish obtained in Synthesis Example 1 was used to measure the percent change in the viscosity of the resin composition by the method of the above-mentioned first item and measure the imidization rate of the resin (a) by the method of the above-mentioned seventh item.

Subsequently, using a slit coating apparatus (manufactured by Toray Engineering Co., Ltd.), the varnish in Synthesis Example 1 was applied onto an area inside, by 5 mm, from the edge of a non-alkali glass substrate (AN-100, manufactured by Asahi Glass Co., Ltd.) having a size of length 350 mm×width 300 mm×thickness 0.5 mm. Then, heating and vacuum-drying was performed at a temperature of 40° C. in the same apparatus. Finally, using a gas oven (INH-21CD, manufactured by Koyo Thermo Systems Co., Ltd.), heating was performed at 400° C. for 30 minutes in a nitrogen atmosphere (having an oxygen concentration of 100 ppm or less) to form a resin film having a film thickness of 10 μm on the glass substrate. The obtained resin film on the substrate was measured for in-plane uniformity by the method of the above-mentioned fifth item.

Subsequently, the glass substrate was immersed in hydrofluoric acid for four minutes to detach the resin film from the glass substrate, followed by air-drying the resin film. The obtained resin film was measured for tensile elongation percentage and tensile maximum stress by the method of the above-mentioned second item, measured for CTE by the method of the above-mentioned third item, and measured for CTE (A) and CTE (B) by the method of the above-mentioned fourth item.

Subsequently, a SiO film having a film thickness of 100 nm and a SiN film having a film thickness of 100 nm were formed, by CVD, on the resin film which was yet to be detached from the glass substrate. Furthermore, laser (having a wavelength of 308 nm) was applied to that side of the glass substrate which did not have the resin film formed thereon, and detachment was carried out along the interface with the resin film. The obtained laminate composed of a resin film and an inorganic film was used to carry out the bending test in accordance with the method of the above-mentioned sixth item.

Subsequently, a TFT was formed on the resin film that was yet to be detached from the glass substrate, and an insulation film composed of SiN was formed so as to cover the TFT. Then, a contact hole was produced in this insulation film, and wiring connecting to the TFT through this contact hole was formed.

In addition, a planarizing film was formed to planarize the irregularities formed by the wiring. Then, on top of the resulting planarizing film, an ITO-based first electrode connecting to the wiring was formed. Then, the surface was coated with a resist, prebaked, exposed to light through a desired patterned mask, and developed. Using this resist pattern as mask, patterning was performed by wet etching with an ITO etchant. Subsequently, the resist pattern was removed using a resist stripping liquid (a liquid mixture of monoethanol amine and diethylene glycol monobutyl ether). After the removal step, the substrate was rinsed and heated for dehydration to provide an electrode substrate having a planarizing film. Next, an insulation film was formed in a shape that covers the periphery of the first electrode.

In addition, in a vacuum deposition apparatus, a positive hole transport layer, organic luminescent layer, and electron transport layer were deposited in this order through desired pattern masks. Subsequently, the second electrode of Al/Mg was formed over the entire surface above the substrate. In addition, a sealing film in the form of stacked layers of SiO and SiN was formed by CVD. Finally, laser (having a wavelength of 308 nm) was applied to that side of the glass substrate which did not have the resin film formed thereon, and detachment was carried out along the interface with the resin film.

In the above-mentioned manner, an organic EL display including a display substrate containing a resin film was obtained. The obtained organic EL display was evaluated for reliability by the method of the above-mentioned eighth item.

Examples 2 to 33 and Comparative Examples 1 to 15

In Examples 2 to 33 and Comparative Examples 1 to 15, the varnishes in Synthesis Examples 2 to 48 described in Tables 1 to 3 were used for the same evaluation as in Example 1. However, Synthesis Example 36 and Synthesis Example 37 failed to produce a uniform varnish because the resin precipitated in the synthesizing step, and accordingly, Comparative Example 3 and Comparative Example 4 failed to form a resin film.

The evaluation results obtained in Examples 1 to 33 and Comparative Examples 1 to 15 are shown in Tables 4 to 6.

TABLE 4

| | | Varnish | | | Resin film | | | | | Laminate of resin film and inorganic film | | Organic EL display | |
|---|---|---|---|---|---|---|---|---|---|---|---|---|---|
| | | | | | | | | | | Number of times | | | |
| | Synthesis Example | Percent change in viscosity (%) | Tensile maximum stress (MPa) | Tensile elongation percentage (%) | CTE (ppm/° C.) | CTE (A) (ppm/° C.) | CTE (B) (ppm/° C.) | CTE (B)/CTE (A) | In-plane uniformity (%) | laminate was bent until crack generation | Rating | Number of days before dark spot formation | Rating |
| Example 1 | Synthesis Example 1 | −1.5 | 390 | 39 | 4.2 | 3.5 | 6.0 | 1.7 | 4.3 | >10 | S | >7 | S |
| Example 2 | Synthesis Example 2 | −1.4 | 330 | 35 | 4.0 | 3.2 | 5.1 | 1.6 | 4.1 | >10 | S | >7 | S |
| Example 3 | Synthesis Example 3 | +8.1 | 370 | 32 | 2.4 | 2.1 | 3.4 | 1.6 | 4.8 | >10 | S | >7 | S |
| Example 4 | Synthesis Example 4 | +2.0 | 360 | 35 | 3.3 | 2.9 | 4.9 | 1.7 | 3.9 | >10 | S | >7 | S |
| Example 5 | Synthesis Example 5 | −1.4 | 350 | 33 | 6.2 | 5.6 | 9.0 | 1.6 | 4.2 | 8 | A | 6 | A |
| Example 6 | Synthesis Example 6 | +8.1 | 330 | 34 | 4.2 | 3.7 | 5.9 | 1.6 | 4.1 | >10 | S | >7 | S |
| Example 7 | Synthesis Example 7 | +4.3 | 360 | 35 | 4.0 | 3.2 | 5.1 | 1.6 | 4.4 | >10 | S | >7 | S |
| Example 8 | Synthesis Example 8 | −5.2 | 250 | 24 | 4.2 | 3.1 | 5.3 | 1.7 | 4.6 | 7 | A | 3 | B |
| Example 9 | Synthesis Example 9 | −2.1 | 290 | 30 | 4.4 | 3.2 | 5.1 | 1.6 | 4.3 | 8 | A | 6 | A |
| Example 10 | Synthesis Example 10 | −1.3 | 260 | 25 | 4.3 | 3.6 | 5.4 | 1.5 | 9.8 | >10 | S | 5 | A |
| Example 11 | Synthesis Example 11 | −1.5 | 290 | 31 | 3.9 | 3.2 | 5.1 | 1.6 | 12.8 | 8 | A | 5 | A |
| Example 12 | Synthesis Example 12 | +3.2 | 310 | 30 | 3.8 | 3.1 | 5.6 | 1.8 | 4.1 | >10 | S | 6 | A |
| Example 13 | Synthesis Example 13 | −0.8 | 260 | 23 | 3.9 | 3.0 | 4.2 | 1.4 | 3.9 | 7 | A | 3 | B |
| Example 14 | Synthesis Example 14 | −1.0 | 290 | 27 | 4.1 | 3.3 | 5.0 | 1.5 | 4.6 | >10 | S | 6 | A |
| Example 15 | Synthesis Example 15 | +8.5 | 320 | 31 | 4.3 | 3.5 | 6.7 | 1.9 | 4.5 | 8 | A | 4 | A |
| Example 16 | Synthesis Example 16 | +4.0 | 250 | 26 | 4.2 | 3.5 | 6.3 | 1.8 | 4.7 | 8 | A | 4 | A |
| Example 17 | Synthesis Example 17 | −1.2 | 210 | 30 | 3.9 | 3.1 | 5.3 | 1.7 | 8.9 | 7 | A | 4 | A |

TABLE 5

| | | Varnish | Resin film | | | | | | | Laminate of resin film and inorganic film | | Organic EL display | |
|---|---|---|---|---|---|---|---|---|---|---|---|---|---|
| | | | | | | | | | | Number of times | | | |
| Example | Synthesis Example | Percent change in viscosity (%) | Tensile maximum stress (MPa) | Tensile elongation percentage (%) | CTE (ppm/° C.) | CTE (A) (ppm/° C.) | CTE(B) (ppm/° C.) | CTE (B)/CTE (A) | In-plane uniformity (%) | laminate was bent until crack generation | Rating | Number of days before dark spot formation | Rating |
| Example 18 | Synthesis Example 18 | +2.4 | 300 | 32 | 3.7 | 3.2 | 5.4 | 1.7 | 3.9 | >10 | S | >7 | S |
| Example 19 | Synthesis Example 19 | −1.5 | 240 | 25 | 7.8 | 6.1 | 9.2 | 1.5 | 4.1 | 9 | A | 6 | A |
| Example 20 | Synthesis Example 20 | −1.3 | 320 | 45 | 11.2 | 9.9 | 16.8 | 1.7 | 4.0 | >10 | S | >7 | S |
| Example 21 | Synthesis Example 21 | −1.7 | 340 | 37 | 13.1 | 11.1 | 18.9 | 1.7 | 3.9 | >10 | S | >7 | S |
| Example 22 | Synthesis Example 22 | −1.6 | 270 | 40 | 32.2 | 30.1 | 48.2 | 1.6 | 4.5 | >10 | S | 6 | A |
| Example 23 | Synthesis Example 23 | −1.5 | 280 | 28 | 7.8 | 6.5 | 10.4 | 1.6 | 4.6 | >10 | S | 6 | A |
| Example 24 | Synthesis Example 24 | −1.6 | 290 | 42 | 27.8 | 22.5 | 38.3 | 1.7 | 4.2 | >10 | S | 6 | A |
| Example 25 | Synthesis Example 25 | +4.5 | 350 | 35 | 3.7 | 3.1 | 5.6 | 1.8 | 4.8 | >10 | S | >7 | S |
| Example 26 | Synthesis Example 26 | +4.7 | 340 | 36 | 3.9 | 3.1 | 5.6 | 1.8 | 4.6 | >10 | S | >7 | S |
| Example 27 | Synthesis Example 27 | +3.9 | 360 | 33 | 3.6 | 2.7 | 4.9 | 1.8 | 4.0 | >10 | S | >7 | S |
| Example 28 | Synthesis Example 28 | −1.5 | 350 | 35 | 3.9 | 3 | 5.7 | 1.9 | 8.1 | >10 | S | >7 | S |
| Example 29 | Synthesis Example 29 | −1.5 | 340 | 36 | 3.6 | 2.9 | 5.2 | 1.8 | 4.2 | >10 | S | >7 | S |
| Example 30 | Synthesis Example 30 | +4.0 | 360 | 35 | 4.3 | 3.1 | 5.6 | 1.8 | 6.9 | >10 | S | >7 | S |
| Example 31 | Synthesis Example 31 | −1.5 | 360 | 33 | 4.1 | 3.1 | 5.6 | 1.8 | 3.9 | >10 | S | >7 | S |
| Example 32 | Synthesis Example 32 | −1.5 | 320 | 30 | 3.8 | 3.9 | 6.6 | 1.7 | 13.1 | 8 | A | 5 | A |
| Example 33 | Synthesis Example 33 | −1.5 | 350 | 34 | 4.0 | 3.2 | 5.1 | 1.6 | 5.0 | >10 | S | >7 | S |

TABLE 6

| Example | Synthesis Example | Varnish: Percent change in viscosity (%) | Resin film: Tensile maximum stress (MPa) | Tensile elongation percentage (%) | CTE (ppm/°C) | CTE (A) (ppm/°C) | CTE (B) (ppm/°C) | CTE (B)/CTE (A) | In-plane uniformity (%) | Laminate of resin film and inorganic film: Number of times laminate was bent until crack generation | Rating | Organic EL display: Number of days before dark spot formation | Rating |
|---|---|---|---|---|---|---|---|---|---|---|---|---|---|
| Comparative Example 1 | Synthesis Example 34 | −0.6 | 170 | 16 | 4.1 | 3.8 | 4.2 | 1.1 | 4.7 | 1 | D | 0 | D |
| Comparative Example 2 | Synthesis Example 35 | −0.6 | 190 | 18 | 3.8 | 3.7 | 4.1 | 1.1 | 4.6 | 1 | D | 0 | D |
| Comparative Example 3 | Synthesis Example 36 | precipitated during synthesis | — | — | — | — | — | — | — | — | — | — | — |
| Comparative Example 4 | Synthesis Example 37 | precipitated during synthesis | — | — | — | — | — | — | — | — | — | — | — |
| Comparative Example 5 | Synthesis Example 38 | −14.0 | 260 | 24 | 4.8 | 4.2 | 5 | 1.2 | 7.8 | 7 | A | 1 | C |
| Comparative Example 6 | Synthesis Example 39 | +12.0 | 240 | 25 | 5.3 | 4.5 | 9.5 | 2.1 | 13.2 | 7 | A | 1 | C |
| Comparative Example 7 | Synthesis Example 40 | +10.0 | 250 | 21 | 5.1 | 4.1 | 9 | 2.2 | 12.0 | 7 | A | 1 | C |
| Comparative Example 8 | Synthesis Example 41 | −1.0 | 190 | 13 | 11.7 | 10.9 | 12 | 1.1 | 4.5 | 5 | B | 0 | D |
| Comparative Example 9 | Synthesis Example 42 | +10.2 | 250 | 23 | 2.4 | 2.1 | 4.4 | 2.1 | 11.3 | 3 | C | 1 | C |
| Comparative Example 10 | Synthesis Example 43 | −1.3 | 190 | 12 | 5.6 | 5.5 | 6.1 | 1.1 | 4.2 | 1 | D | 0 | D |
| Comparative Example 11 | Synthesis Example 44 | −1.7 | 200 | 23 | 30.2 | 28.3 | 34 | 1.2 | 4.1 | 7 | A | 0 | D |
| Comparative Example 12 | Synthesis Example 45 | −1.2 | 180 | 18 | 13.8 | 12.5 | 15 | 1.2 | 4.6 | 6 | B | 0 | D |
| Comparative Example 13 | Synthesis Example 46 | −1.0 | 190 | 19 | 15.6 | 14.7 | 16.2 | 1.1 | 4.5 | 6 | B | 0 | D |
| Comparative Example 14 | Synthesis Example 47 | +10.3 | 200 | 24 | 36.4 | 26.2 | 57.6 | 2.2 | 11.8 | 8 | A | 0 | D |
| Comparative Example 15 | Synthesis Example 48 | −1.5 | 170 | 25 | 32.9 | 31.8 | 35 | 1.1 | 4.1 | 7 | A | 0 | D |

As above-mentioned, a resin composition for display substrates, a resin film for display substrates, and a laminate containing the same, which are according to the present invention, are suitable for display substrates having excellent flex resistance and reliability and for image display devices produced and organic EL displays produced using such display substrates.

The invention claimed is:

1. A resin film for display substrates, comprising, as a main component, a repeating unit represented by a chemical formula (4), wherein a ratio of a coefficient of thermal linear expansion (A) of a first face of the resin film for display substrates to a coefficient of thermal linear expansion (B) of a second face of the resin film for display substrates is (A):(B)=1.0:1.3 to 1.0:2.0, wherein said first face is obtained by etching a face of said resin film for display substrates in a film thickness direction to reduce a film thickness to half, and wherein said second face is obtained by etching another face of said resin film for display substrates to reduce the film thickness to half;

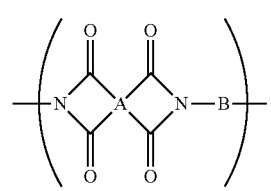

(4)

wherein, in the chemical formula (4), A represents a tetravalent tetracarboxylic acid residue having 2 or more carbon atoms; and B represents a divalent diamine residue having 2 or more carbon atoms and wherein the resin film has an imide group concentration of 35 to 45 mass % when imidized.

2. A resin film for display substrates according to claim 1, wherein the tetravalent tetracarboxylic acids that result in A in formula (4) comprises pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, bis(3,4-dicarboxyphenyl) ether, 1,2,5,6-naphthalenetetracarboxylic acid, 1,4,5,8-naphthalenetetracarboxylic acid, 2,3,6,7-naphthalenetetracarboxylic acid, or 3,4,9,10-perylenetetracarboxylic acid, and wherein the divalent diamines that result in B in formula (4) comprises m-phenylenediamine, 1,5-naphthalenediamine, 2,6-naphthalenediamine, 9,10-anthracenediamine, 2,7-diaminofluorene, 3,4'-diaminodiphenyl ether, 3,4'-diaminodiphenylmethane, 4,4'-diaminodiphenylmethane, 3,4'-diaminodiphenyl sulfide, 4,4'-diaminodiphenyl sulfide, 4-aminophenyl 4-aminobenzoate, 9,9-bis(4-aminophenyl) fluorene, 4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, bis(4-aminophenoxy)biphenyl, bis[4-(4-aminophenoxy)phenyl] ether, 2,2-bis[4-(4-aminophenoxy)phenyl] propane, 2,2-bis[4-(4-aminophenoxy)phenyl] hexafluoropropane, 1,4-bis(4-aminophenoxy)benzene, 1,3-bis(3-aminophenoxy)benzene, 1,3-bis(4-aminophenoxy)benzene, 2-(4-aminophenyl)-5-aminobenzoxazole, 2-(3-aminophenyl)-5-aminobenzoxazole, 2-(4-aminophenyl)-6-aminobenzoxazole, 2-(3-aminophenyl)-6-aminobenzoxazole, 2,2'-bis[(3-aminophenyl)-5-benzoxazolyl]hexafluoropropane, 2,2'-bis[(4-aminophenyl)-5-benzoxazolyl]hexafluoropropane, bis[(3-aminophenyl)-5-benzoxazolyl], bis[(4-aminophenyl)-5-benzoxazolyl], bis[(3-aminophenyl)-6-benzoxazolyl], bis[(4-aminophenyl)-6-benzoxazolyl], p-phenylene diamine, 2,2'-di(trifluoromethyl)-4,4'-diaminobiphenyl, 4,4'-diaminodiphenyl ether, or 2,2'-dimethyl-4,4'-diaminobiphenyl.

3. A resin film for display substrates according to claim 2, wherein A is represented by one of the following chemical formulae: (5), (6), (10), (11), (12), or (13):

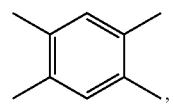

(5)

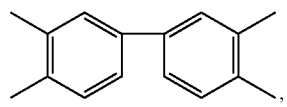

(6)

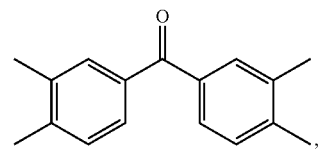

(10)

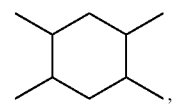

(11)

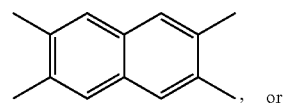

(12)

, or

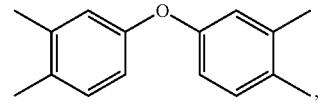

(13)

and wherein B is represented by one of the following chemical formulae: (7), (14), (15), or (16):

(7)

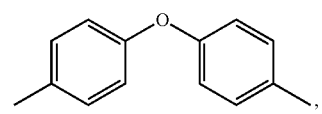

(14)

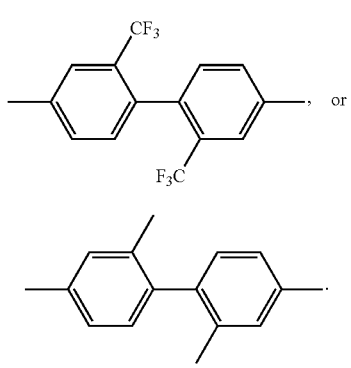

4. A resin film for display substrates according to claim 1, wherein the resin film has a tensile elongation percentage of 20% or more.

5. A resin film for display substrates according to claim 1, wherein the resin film has a tensile maximum stress of 200 MPa or more.

6. A resin film for display substrates according to claim 1, wherein the resin film contains a total of 95 mass % or more of a tetracarboxylic acid residue having an SP value of 15 or more and 17 or less and a diamine residue having an SP value of 11 or more and 13 or less with respect to the total of 100 mass % of A and B contained in the resin film.

7. A laminate composed of said resin film for display substrates according to claim 1 and an inorganic film, wherein a face of said resin film for display substrates to be in contact with said inorganic film is selected by the method comprising etching the resin film for display substrates from a face in the film thickness direction to a thickness of half of an original thickness to obtain a first resin film; etching another resin film for display substrates from another face in the film thickness direction to a thickness of half of the original thickness to obtain a second resin film; comparing coefficients of thermal linear expansion of said first and second resin films; and selecting a face of said first or second resin film having a smaller coefficient of thermal linear expansion as said face to be in contact with said inorganic film.

8. An image display device comprising said resin film for display substrates according to claim 1.

9. An image display device comprising said laminate according to claim 7.

10. An organic EL display comprising said laminate according to claim 7.

11. An organic EL display comprising said resin film for display substrates according to claim 1.

* * * * *